United States Patent
Diorio et al.

(10) Patent No.: US 7,049,872 B2
(45) Date of Patent: May 23, 2006

(54) USE OF ANALOG-VALUED FLOATING-GATE TRANSISTORS TO MATCH THE ELECTRICAL CHARACTERISTICS OF INTERLEAVED AND PIPELINED CIRCUITS

(75) Inventors: Christopher J. Diorio, Shoreline, WA (US); Todd E. Humes, Shoreline, WA (US); Michael Thomas, Seattle, WA (US)

(73) Assignee: IMPINJ, Inc., Seattle, WA (US)

( * ) Notice: Subject to any disclaimer, the term of this patent is extended or adjusted under 35 U.S.C. 154(b) by 0 days.

(21) Appl. No.: 10/681,577

(22) Filed: Oct. 7, 2003

(65) Prior Publication Data

US 2004/0124892 A1  Jul. 1, 2004

Related U.S. Application Data

(60) Provisional application No. 60/417,072, filed on Oct. 8, 2002.

(51) Int. Cl.
*H03H 11/26* (2006.01)

(52) U.S. Cl. .................. 327/276; 327/234; 327/403
(58) Field of Classification Search ............. 327/231, 327/233, 234, 237, 250, 251, 257, 258, 261, 327/276, 285, 293, 295, 403, 404
See application file for complete search history.

(56) References Cited

U.S. PATENT DOCUMENTS

| | | | |
|---|---|---|---|
| 3,958,236 A | 5/1976 | Kelly | 341/128 |
| 4,163,947 A | 8/1979 | Weedon | 327/341 |
| 4,763,105 A | 8/1988 | Jenq | 340/347 |
| 4,783,783 A | 11/1988 | Nagai et al. | 714/17 |
| 4,914,440 A | 4/1990 | Ramet | 341/140 |
| 4,935,702 A | 6/1990 | Mead et al. | 365/185.32 |
| 4,962,380 A | 10/1990 | Meadows | 341/120 |
| 4,968,988 A | 11/1990 | Miki et al. | 341/141 |
| 5,029,063 A | 7/1991 | Lingstaedt et al. | 363/60 |
| 5,099,156 A | 3/1992 | Delbruck | 327/63 |
| 5,159,337 A * | 10/1992 | Lankreijer | 341/67 |
| 5,243,347 A | 9/1993 | Jackson et al. | 341/144 |
| 5,270,963 A | 12/1993 | Allen et al. | 364/861 |
| 5,329,240 A * | 7/1994 | Kubota et al. | 327/231 |

(Continued)

FOREIGN PATENT DOCUMENTS

EP   0 298 618 A   1/1989

OTHER PUBLICATIONS

Diorio et al., "Adaptive CMOS: From Biological Inspiration to Systems-on-a-Chip", Mar. 2002, Proceedings of the IEEE, vol. 90, No. 3, p. 345-357.

(Continued)

*Primary Examiner*—Timothy P. Callahan
*Assistant Examiner*—Hai L. Nguyen
(74) *Attorney, Agent, or Firm*—Thelen Reid & Priest LLP; David B. Ritchie

(57) ABSTRACT

Methods of and apparatuses for matching the signal delay, clock timing, frequency response, gain, offset, and/or transfer function of signal pathways in electrical circuits such as, for example, time-interleaved and pipelined circuits using analog-valued floating-gate MOSFETs are disclosed. The methods and apparatuses disclosed are applicable to a variety of circuits, including but not limited to, sample-and-hold or track-and-hold circuits, quadrature mixers, analog-to-digital converters (ADCs), digital-to-analog converters (DACs), analog or digital filters, and amplifiers.

28 Claims, 22 Drawing Sheets

U.S. PATENT DOCUMENTS

| | | | | |
|---|---|---|---|---|
| 5,332,997 | A | 7/1994 | Dingwall et al. | 341/150 |
| 5,376,935 | A | 12/1994 | Seligson | 341/136 |
| 5,553,030 | A | 9/1996 | Tedrow et al. | 365/226 |
| 5,608,400 | A | 3/1997 | Pellon | 341/143 |
| 5,627,392 | A | 5/1997 | Diorio et al. | 257/315 |
| 5,666,118 | A | 9/1997 | Gersbach | 341/120 |
| 5,710,563 | A | 1/1998 | Vu et al. | 341/161 |
| 5,790,060 | A | 8/1998 | Tesch | 341/119 |
| 5,825,063 | A | 10/1998 | Diorio et al. | 257/316 |
| 5,825,317 | A | 10/1998 | Anderson et al. | 341/120 |
| 5,841,384 | A | 11/1998 | Herman et al. | 341/138 |
| 5,852,640 | A * | 12/1998 | Kliza et al. | 375/356 |
| 5,870,044 | A | 2/1999 | Dell'ova et al. | 341/120 |
| 5,870,048 | A | 2/1999 | Kuo et al. | 341/143 |
| 5,875,126 | A | 2/1999 | Minch et al. | 365/185.01 |
| 5,898,613 | A | 4/1999 | Diorio et al. | 365/185.03 |
| 5,914,894 | A | 6/1999 | Diorio et al. | 365/185.03 |
| 5,917,440 | A | 6/1999 | Khoury | 341/143 |
| 5,933,039 | A | 8/1999 | Hui et al. | 327/202 |
| 5,939,945 | A | 8/1999 | Thewes et al. | 320/277 |
| 5,952,891 | A | 9/1999 | Boudry | 331/57 |
| 5,952,946 | A | 9/1999 | Kramer et al. | 341/136 |
| 5,955,980 | A | 9/1999 | Hanna | 341/120 |
| 5,982,313 | A | 11/1999 | Brooks et al. | 341/143 |
| 5,982,315 | A | 11/1999 | Bazarjani et al. | 341/143 |
| 5,986,927 | A | 11/1999 | Minch et al. | 365/185.01 |
| 5,990,512 | A | 11/1999 | Diorio et al. | 257/314 |
| 6,020,773 | A * | 2/2000 | Kan et al. | 327/271 |
| 6,118,398 | A | 9/2000 | Fisher et al. | 341/148 |
| 6,125,053 | A | 9/2000 | Diorio et al. | 365/185.03 |
| 6,130,632 | A | 10/2000 | Opris | 341/120 |
| 6,134,182 | A | 10/2000 | Pilo et al. | 365/233 |
| 6,137,431 | A | 10/2000 | Lee et al. | 341/161 |
| 6,144,581 | A | 11/2000 | Diorio et al. | 365/185.03 |
| 6,169,503 | B1 | 1/2001 | Wong | 341/136 |
| 6,172,631 | B1 | 1/2001 | Tsai et al. | 341/143 |
| 6,191,715 | B1 | 2/2001 | Fowers | 341/120 |
| 6,219,384 | B1 * | 4/2001 | Kliza et al. | 375/258 |
| 6,266,362 | B1 | 7/2001 | Tuttle et al. | 375/141 |
| 6,317,066 | B1 | 11/2001 | Chiang | 341/144 |
| 6,320,788 | B1 | 11/2001 | Sansbury et al. | 365/185.1 |
| 6,351,158 | B1 * | 2/2002 | Shearon et al. | 327/108 |
| 6,373,417 | B1 | 4/2002 | Melanson | 341/143 |
| 6,373,418 | B1 | 4/2002 | Abbey | 341/143 |
| 6,424,279 | B1 | 7/2002 | Kim et al. | 341/143 |
| 6,448,833 | B1 * | 9/2002 | Hirose | 327/284 |
| 6,496,128 | B1 | 12/2002 | Wiesbauer et al. | 341/143 |
| 6,522,275 | B1 | 2/2003 | May | 341/143 |
| 6,522,282 | B1 * | 2/2003 | Elbornsson | 341/155 |
| 6,570,518 | B1 | 5/2003 | Riley et al. | 341/143 |
| 6,573,853 | B1 | 6/2003 | Mulder | 341/155 |
| 6,653,877 | B1 * | 11/2003 | Tsujino | 327/161 |
| 6,664,909 | B1 | 12/2003 | Hyde et al. | 341/144 |
| 2001/0020861 | A1 | 9/2001 | Hirose | 327/284 |
| 2001/0054920 | A1 | 12/2001 | Tsujino | 327/141 |
| 2002/0089440 | A1 | 7/2002 | Kranz et al. | 327/112 |

OTHER PUBLICATIONS

Figueroa et al., "A Floating-Gate Trimmable High-Resolution DAC in Standard 0.25 μm CMOS", Aug. 2001, Nonvolatile Semiconductor Memory Workshop, Monterey, CA, pp. 46-47.

Hyde et al., "A Floating-Gate Trimmed, 14-Bit, 250 Ms/s Digital-to-Analog Converter in Standard 0.25 μm CMOS", 2002, Symposium on VLSI Circuits, Honolulu, HI, pp. 328-331.

Bastos, et al., "A 12-bit Intrinsic Accuracy High-Speed CMOS DAC", IEEE Journal of Solid-State Circuits, vol. 33, No. 12, Dec. 1998, pp. 1959-1969.

Bugeja, et al., "A Self-Trimming 14-b 100-MS/s CMOS DAC", IEEE Journal of Solid-State Circuits, vol. 35, No. 12, Dec. 2000, pp. 1841-1852.

Bugeja, et al., "A 14-b, 100-MS/s CMOS DAC Designed for Spectral Performance", IEEE Journal of Solid-State Circuits, vol. 34, No. 12, Dec. 1999, pp. 1719-1732.

Diorio, et al., "A High-Resolution Non-Volatile Analog Memory Cell", IEEE, 1995, pp. 2233-2236.

Diorio, "A p-Channel MOS Synapse Transistor with Self-Convergent Memory Writes", IEEE Transaction On Electron Devices, vol. 47, No. 2, pp. 464-472, Feb. 2000.

SGS-Thomson Microelectronics, "An Overview of the Serial Digital Interface", 1994, pp. 1-28.

Tille, et al., "A 1.8-V MOSFET-Only Σ Δ Modulator Using Substrate Biased Depletion-Mode MOS Capacitors in Series Compensation", IEEE, Journal of Solid-State Circuits, vol. 36, No. 7, Jul. 2001, pp. 1041-1046.

Tsividis, et al., "Continuous-Time MOSFET-C Filters in VLSI", IEEE Transactions on Circuits and Systems, vol. CAS-33, No. 2, Feb. 1986, pp. 125-140.

Van der Plas, et al., "A 14-bit Instrinsic Accuray $\delta^2$ Random Walk CMOS DAC", IEEE Journal of Solid-State Circuits, vol. 34, No. 12, Dec. 1999, pp. 1708-1718.

Vittoz, "Dynamic Analog Techniques", Design of MOS VLSI Circuits for Telecommunications, 1985, pp. 145-170.

Vittoz, "Dynamic Analog Techniques", Design of Analog-Digital VLSI Circuits for Telecommunications and Signal Processing, Chapter 4, 1994, pp. 97-124.

Vittoz, "Continuous-Time Filters", Design of Analog-Digital VLSI Circuits for Telecommunications and Signal Processing, Chapter 6, 1994, pp. 177-211.

Vittoz, "Analog-Digital Conversion Techniques for Telecommunications Applications", Design of Analog-Digital VLSI Circuits for Telecommunications and Signal Processing, Chapter 9, 1994, pp. 289-315.

Vittoz, "Delta-Sigma Data Converters", Design of Analog-Digital VLSI Circuits for Telecommunications and Signal Processing, Chapter 10, 1994, pp. 317-339.

Partial International Search for International Application No. PCT/US03/31792, date mailed Apr. 2, 2004.

Carley, L. Richard, "Trimming Analog Circuits Using Floating-Gate Analog MOS Memory", IEEE Journal of Solid-State Circuits, vol. 24, No. 6, pp. 1569-1575, Dec. 1989.

Low et al., "Basics of Floating-Gate Low-Dropout Voltage Regulators", IEEE Midwest Symp. on Circuits and Systems, Aug. 8-11, 2000, pp. 1048-1051.

International Search Report for application PCT/US 03/31792, date mailed Aug. 12, 2004.

* cited by examiner

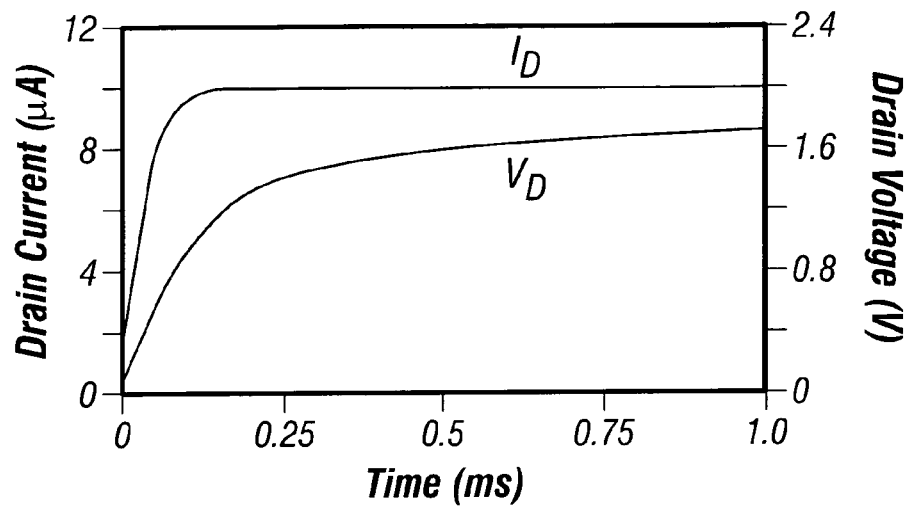
FIG. 16B
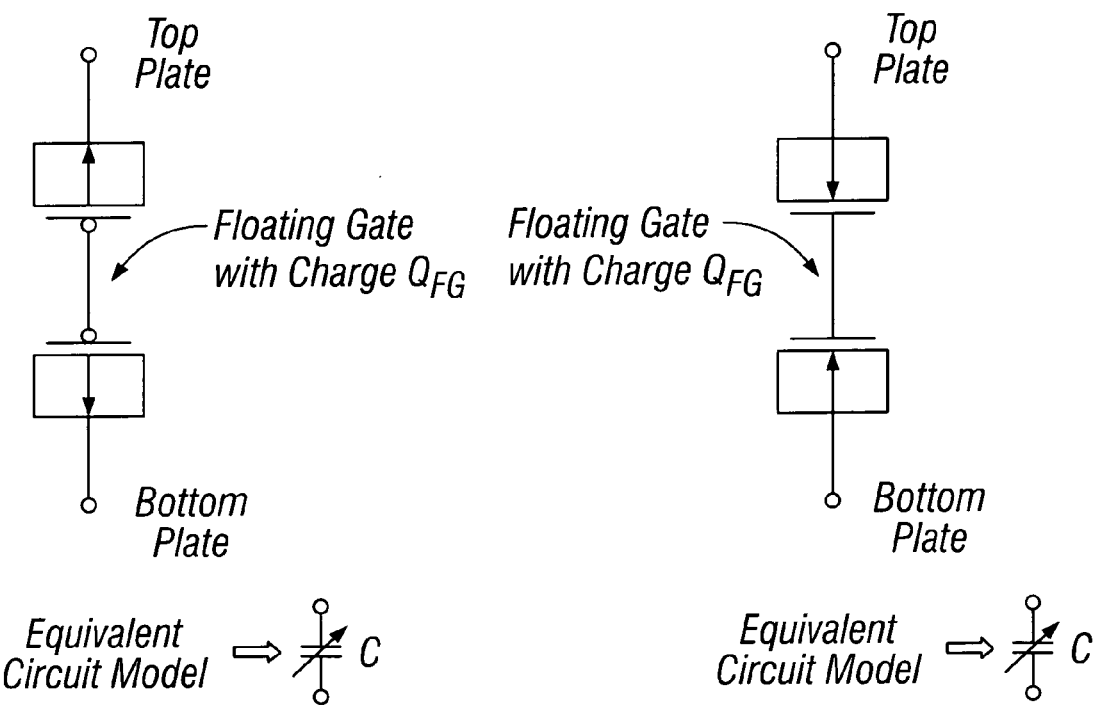
FIG. 17A  FIG. 17B

USE OF ANALOG-VALUED FLOATING-GATE TRANSISTORS TO MATCH THE ELECTRICAL CHARACTERISTICS OF INTERLEAVED AND PIPELINED CIRCUITS

CROSS-REFERENCE TO RELATED APPLICATIONS

This application claims the benefit of U.S. Provisional Application No. 60/417,072, filed on Oct. 8, 2002.

FIELD OF THE INVENTION

The present invention is directed to the use of analog-valued floating-gate transistors as trim devices in electrical circuits such as, for example, time-interleaved and pipelined circuits.

BACKGROUND OF THE INVENTION

To improve the performance of radio-frequency, analog, or mixed-signal circuits, engineers often use techniques know as interleaving and pipelining. Interleaving is a technique that allows a signal to be processed in multiple parallel pathways at successive instants in time. Pipelining is a technique that allows a signal to be processed multiple times serially at successive instants in time. Both techniques allow multiple circuit elements to operate on a single analog signal, thereby improving the processing performance of the circuit. Performance in this context might mean, for example increasing the speed or resolution (where resolution is equivalent to dynamic range) of the circuit.

FIG. 1 is a block diagram of a time-interleaved system 10. A number, M, of typically identical processing elements 12-1, 12-2, 12-3, . . . ,12-M are configured to operate at a rate of 1/M times a circuit sampling rate Fs. Interleaving divides the frequency of a full-rate clock by a factor M and synthesizes M phased lower-speed sampling clocks 16-1, 16-2, 16-3, . . . ,16-M. The phases of successive lower-speed clocks are typically offset by $\Phi=360°/M$, thereby forming equally spaced sampling instants of rates Fs/M. An optional combining operation 18 may then be used to combine the sampled signals. Such a combining operation might comprise adding or multiplexing, or may comprise a more complex operation such as filtering or averaging.

FIG. 2 is a block diagram of a pipelined system 20 that is capable of processing an input signal into one or more output signals. A signal is received at input node 22 and sequentially processed by M processing elements 24-1, 24-2, 24-3, . . . ,24-M. Processing elements 24-1, 24-2, 24-3, . . . ,24-M have associated inputs 26-1, 26-2, 26-3, . . . ,26-M and associated outputs 28-1, 28-2, 28-3, . . . ,28-M, each output of which is cascaded into a next element's input. Optional combinational outputs 30-1, 30-2, 30-3, . . . ,30-M may also be coupled to a combining operation 32, which may have additional secondary inputs 34. Pipelined system 20 may also have one or more feedback or feedforward loops and may output one or more outputs at output node 35.

Ideally, each of the nominally identical subsystem pathways in time-interleaved and pipelined systems have identical gain, offset, signal delay, clock timing, frequency response, and transfer function. In practice, however, no two circuit elements are the same. For example, in integrated circuit implementations of such systems, device-to-device mismatches are the result of process and temperature gradients. Such mismatches are problematic as they can result in subsystem pathways not having identical gain, offset, signal delay, clock timing, frequency response, and/or transfer function. Consequently, regardless of how well the individual processing elements perform on their own, errors can result in time-interleaved and pipelelined systems due to device-to-device mismatches. Such errors occur irrespective of whether the system is time-sampled or continuous, and regardless of whether the processing elements are arranged in parallel (as in the time-interleaved system shown in FIG. 1) or serially (as in the pipelined system shown in FIG. 2). Accordingly, device mismatch is a major concern, and it must be addressed and minimized if the benefits of time-interleaving and pipelining are to be exploited.

A number of solutions have been proposed to address mismatch of transistors in integrated circuits. Some of these approaches, which may or may not be useful in reducing device mismatch in time-interleaved and pipelined systems, include using large transistors, using lasers to trim resistors or fuses, and using capacitors to dynamically match devices in response to on-chip error signals. Unfortunately, each of these approaches has significant disadvantages. For instance, large transistors require large currents to operate at high speeds, consume large silicon area and power, and do not compensate for temperature or aging errors. Similarly, laser-trimming resistors or fuses necessitates use of large resistors or fuses, requires time-consuming laboratory trimming, and again does not compensate for temperature or aging errors. Finally, using capacitors to dynamically trim circuit elements requires wideband error-feedback loops and frequent updates, because on-chip capacitors leak due to the thermal generation of carriers in pn junctions.

SUMMARY OF THE INVENTION

Methods of and apparatuses for matching the signal delay, clock timing, frequency response, gain, offset, and/or transfer function of signal pathways in electrical circuits such as, for example, time-interleaved and pipelined circuits using analog-valued floating-gate transistors are disclosed. The methods and apparatuses disclosed are applicable to a variety of circuits, including but not limited to, sample-and-hold or track-and-hold circuits, quadrature mixers, analog-to-digital converters (ADCs), digital-to-analog converters (DACs), analog or digital filters, and amplifiers.

BRIEF DESCRIPTION OF THE DRAWINGS

FIG. 16B shows the drain current and drain voltage as a function of time for the precision current storing circuit shown in FIG. 16A;

FIG. 17A shows how the p-channel floating-gate MOSFET structures shown in FIGS. 3A–3E, or equivalent structures, can be used to implement a trimmable capacitor;

FIG. 17B shows how n-channel floating gate MOSFET structures, or equivalent structures, can be used to implement a trimmable capacitor;

DETAILED DESCRIPTION

Embodiments of the present invention are described herein in the context of using analog-valued floating-gate transistors as trim devices in time-interleaved and pipelined circuits. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. Unless indicated otherwise, the same reference indicators will be used throughout the drawings and the following detailed description to refer to the same or like parts.

In the interest of clarity, not all of the routine features of the implementations described herein are shown and described. It will of course be appreciated that, in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In U.S. Pat. No. 5,990,512 Diorio et al. describe an analog-valued floating-gate MOSFET whose input-output characteristics can be continuously adjusted during normal transistor operation by adding electrons to or removing electrons from the floating gate. These kinds of transistors, equivalents thereof, and other floating-gate MOSFET structures are used in various embodiments of the present invention to match the signal delay, clock timing, frequency response, gain, offset, and/or transfer function of signal pathways in circuits, including time-interleaved and pipelined integrated circuits. As described below, these embodiments use channel hot-electron injection (CHEI) or impact-ionized hot-electron injection (IHEI) to add electrons to the floating gate of the floating-gate MOSFET structures, and Fowler-Nordheim tunneling to remove electrons from the floating gate of the MOSFET structures. Nevertheless, other charge transfer mechanisms may be employed to modify the charge on the floating gate, depending on the type of floating-gate structure employed. For example, if the dielectric layer separating the floating-gate MOSFET substrate and floating gate is thin enough (e.g. less than on the order of about 100 Å), direct tunneling may be used to modify the number of electrons resident on the floating gate.

Figure 3A:
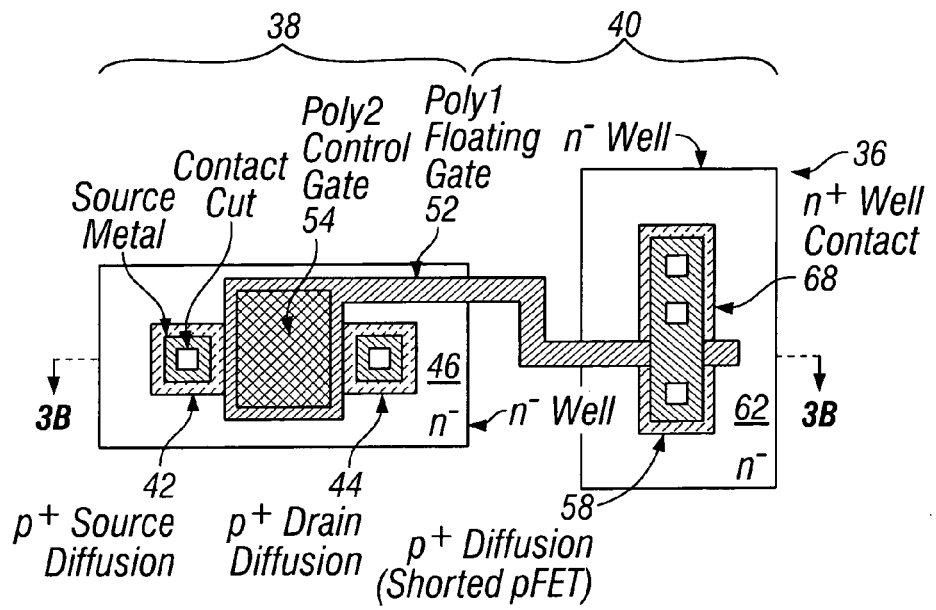
FIG. 3A is a layout diagram of a p-channel floating-gate MOSFET having continuously adjustable I/O characteristics determined by the addition or removal of electrons from the floating gate of the MOSFET.
Figure 3B:
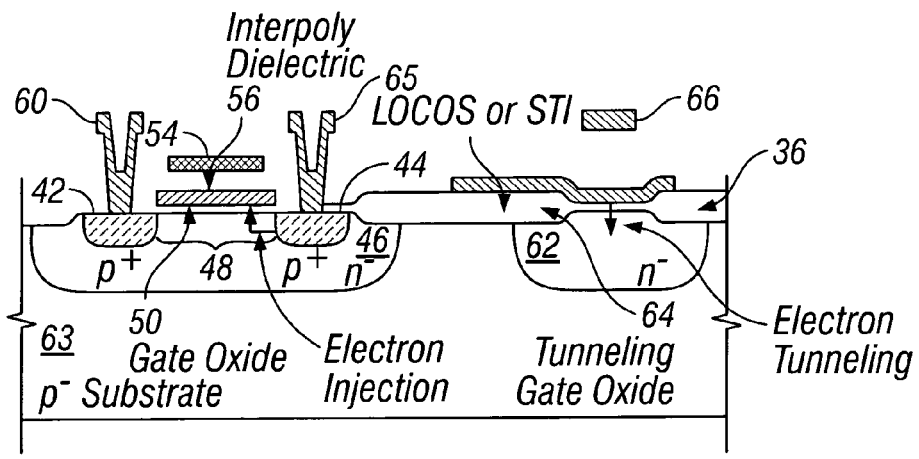
FIG. 3B is a cross-sectional diagram of the p-channel floating-gate MOSFET shown in FIG. 3A.

FIGS. 3A–3D illustrate a p-channel floating-gate MOSFET 36 of the type disclosed in U.S. Pat. No. 5,990,512. FIG. 3A, in particular, shows an exemplary layout view of the p-channel floating-gate MOSFET 36 and FIG. 3B shows a cross-section of the MOSFET 36 taken along line 2B—2B. P-channel floating-gate MOSFET 36 is comprised of an electron injection region 38 and an electron tunneling region 40. Injection region 38 includes p+ source and drain diffusions (or implants) 42 and 44 (doping levels on the order of $10^{21}$ cm$^{-3}$), which are both diffused in a first n− well 46 (doping level on the order of $10^{17}$ cm$^{-3}$). Above a channel region 48 of first n− well 46 is a gate dielectric 50, a polysilicon floating gate 52, a polysilicon control gate 54, and an interpoly dielectric layer 56 that isolates floating gate 52 from control gate 54. Floating gate 52 extends laterally across the device structure to tunneling region 40. Tunneling region 40 comprises a shorted (source and drain shorted together) p-channel MOSFET 58, which is formed in a second n− well 62 (doping level on the order of $10^{17}$ cm$^{-3}$) that, like first n− well 46, is diffused into a p-type substrate 63 (doping level on the order of $10^{17}$ cm$^{-3}$). Above and between second n− well 62 and floating gate 52 is a tunneling dielectric layer 64. A tunneling control contact 66 overlies floating gate 52 in the vicinity of tunneling region 40 as shown. An n+ region 68 (doping level on the order of $10^{21}$ cm$^{31\ 3}$) is formed in second n− well 62 and is shorted to drain 58 and source 60 by tunneling control contact 66.

Figure 3C:
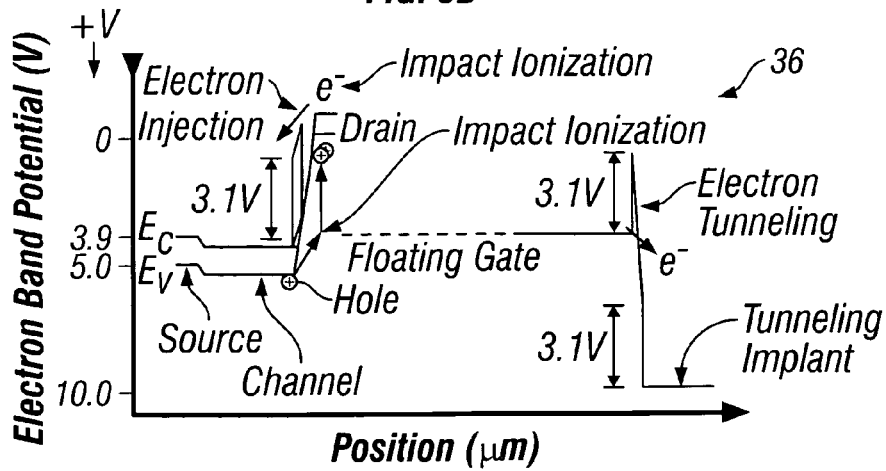
FIG. 3C is an energy band diagram of the p-channel floating-gate MOSFET shown in FIGS. 3A and 3B.
Figure 3D:
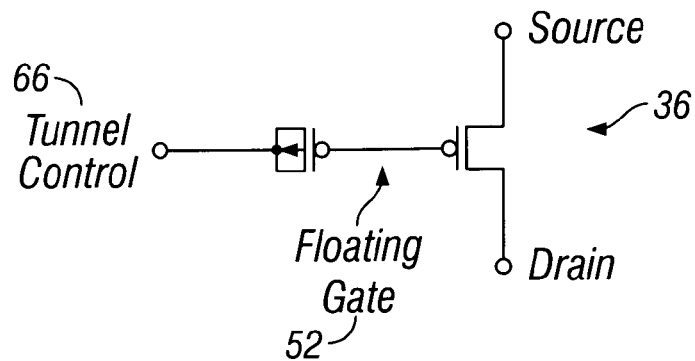
FIG. 3D is circuit diagram of the p-channel floating-gate MOSFET shown in FIGS. 3A–3C that can be used to add or remove electrons from the floating gate of the MOSFET.

FIG. 3C shows an energy band diagram of the p-channel floating-gate MOSFET 36 shown in FIGS. 3A and 3B and FIG. 3D shows a circuit diagram of the p-channel floating-gate MOSFET 36.

Removing electrons from or adding electrons to floating gate 52 allows the threshold voltage of p-channel floating-gate MOSFET 36 to be varied and controlled. By applying a sufficiently positive voltage to tunneling control contact 66, Fowler-Nordheim (FN) tunneling occurs and electrons are removed from floating gate 52. By appropriately biasing control gate 54 and source and drain contacts 60 and 65 of source and drain diffusions 42 and 44, impact-ionized hot-electron injection (IHEI) is used to add electrons to floating gate 52. Generally, use of IHEI to add electrons to floating gate 52 proceeds as follows. When a sufficiently negative voltage (relative to source diffusion 42) is applied to drain diffusion 44, positively charged holes are accelerated in channel 48 toward drain diffusion 44. The accelerated holes impact with the crystalline lattice in the region of drain diffusion 44 and form electron-hole pairs. The electrons are then repelled by the relatively negative drain and may, if scattered upward toward the floating gate, be injected across gate dielectric 50 onto floating gate 52.

From the perspective of the control gate 54, p-channel floating-gate MOSFET 36 remains a conventional p-channel MOSFET, albeit with reduced coupling to the channel due to the presence of interpoly dielectric layer 56. Accordingly, signal inputs are applied to control gate 54, which, in turn, are capacitively coupled to floating gate 52.

Figure 3E:
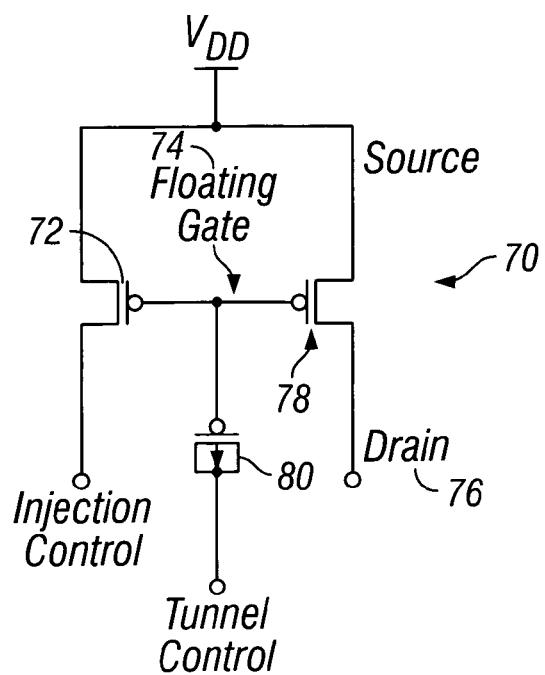
FIG. 3E is a circuit diagram of an alternative p-channel floating-gate MOSFET structure that can be used to add or remove electrons from the floating gate of the MOSFET structures.

FIG. 3E shows a circuit diagram of an alternative p-channel floating-gate MOSFET structure 70 that can be used to add or remove electrons from the floating gate of the MOSFET structure 70. This alternative embodiment includes a p-channel MOSFET 72 that is dedicated to controlling electron injection onto the floating gate 74 of the structure 70. Use of dedicated injection control MOSFET 72 prevents having to switch the drain 76 of p-channel floating-gate MOSFET 78 in and out of the circuit in which it is incorporated in order to affect electron injection onto floating gate 74. Also coupled to floating gate 74 is a shorted p-channel floating-gate MOSFET 80 that has a tunneling control input to effect electron tunneling off of floating gate 74.

Whereas the floating-gate MOSFET structures in FIGS. 3A–3E are shown to be comprised of p-channel MOSFETs, those of ordinary skill in the art will understand that similar structures can be made using n-channel MOSFETs by using complementary doping schemes. Further, whereas a double-poly structure is shown in FIGS. 3A–3C, single-poly floating-gate MOSFET structures may be used, as will be readily appreciated and understood by those of ordinary skill in the art. Still further, those of ordinary skill in the art will understand that, whereas the tunneling portions of the floating MOSFET structures shown in FIGS. 3A–3E are shown as comprising shorted MOSFETs, a MOS capacitor manufactured without a source and drain or with only a single source or drain region may be used to implement the tunneling functions of the floating-gate MOSFET structures. Finally, those of ordinary skill in the art will understand that the doping concentrations, layer thicknesses, ways of removing and adding charge to the floating gate of the floating-gate MOSFET structures may be varied as necessary to perform the matching and trimming operations described in detail below.

Figure 4A:
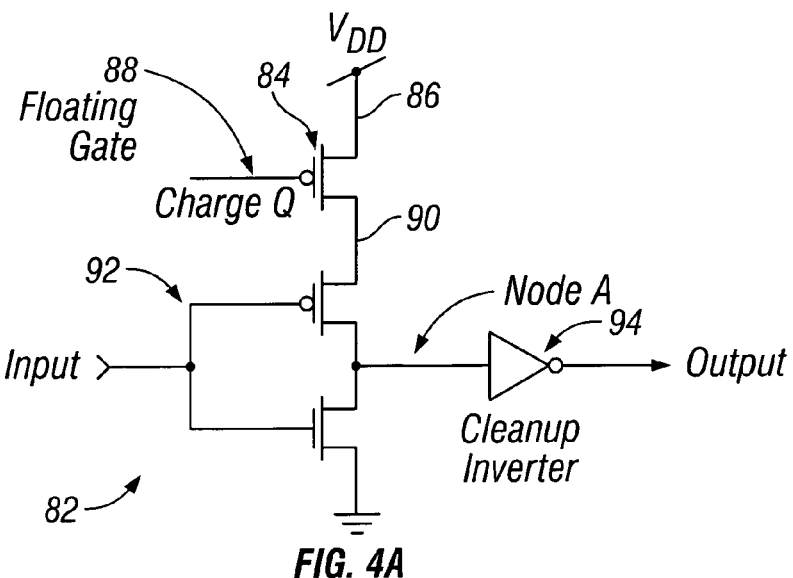
FIG. 4A is a circuit diagram of a delay structure that can be used to implement delays at various positions in a time-interleaved or pipelined system, according to an embodiment of the present invention.

According to embodiments of the present invention, the floating-gate MOSFET structures 36 and 70 in FIGS. 3A–3E, or structures equivalent to them, can be used to implement delays or other matching functions in time-interleaved and pipelined structures. FIG. 4A shows a circuit diagram of a delay structure 82 that utilizes a p-channel floating-gate MOSFET structure 84 of the type described above. P-channel floating-gate MOSFET structure 84 has a source 86 that is coupled to a power source (Vdd) a floating gate 88 and a drain 90 that is coupled to a CMOS inverter 92. CMOS inverter 92 has an input and an output that is optionally coupled to a cleanup inverter 94.

Figure 4B:
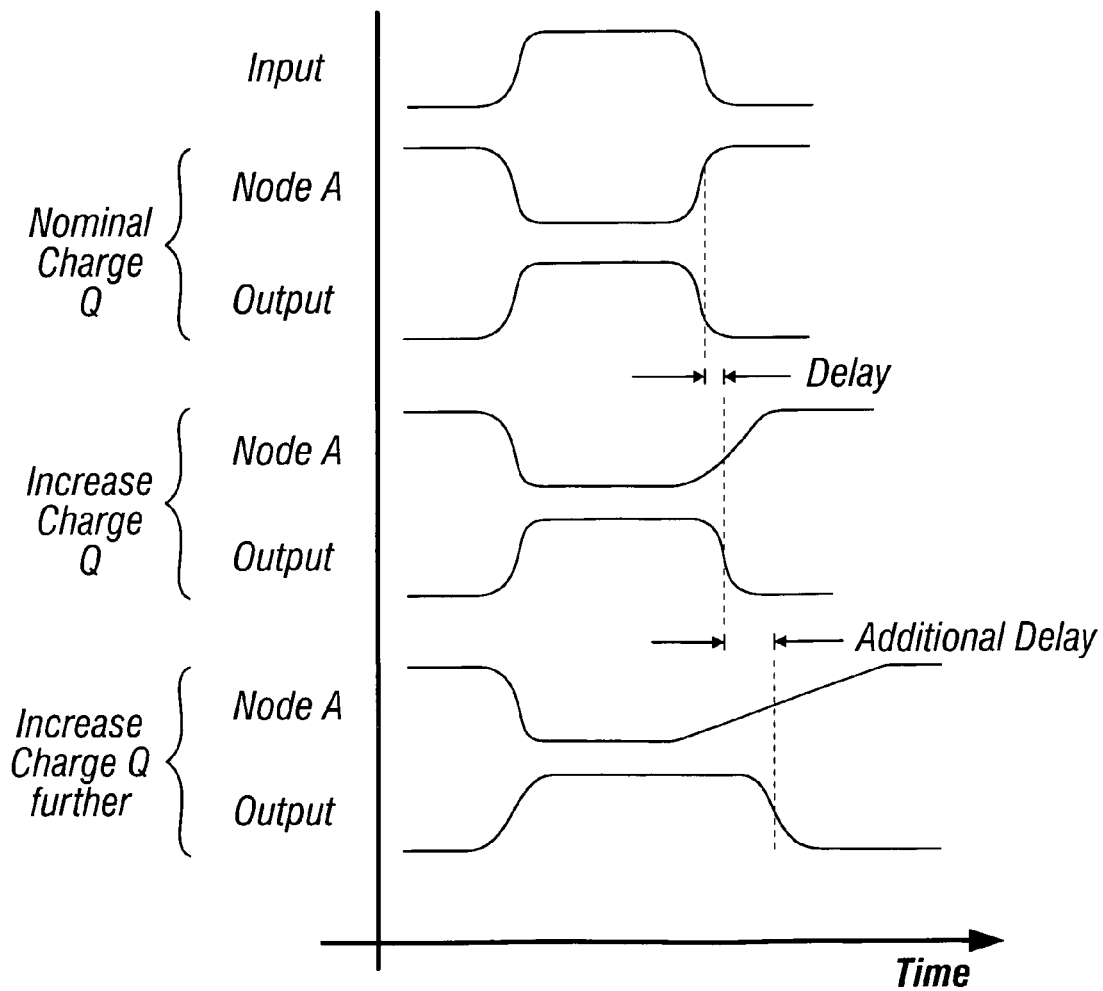
FIG. 4B is a timing diagram showing how the delay structure in FIG. 4A may be used to provide varying delays, depending on the amount of charge stored on the floating gate of the p-channel floating-gate MOSFET of the delay structure, according to an embodiment of the present invention.
Figure 4C:
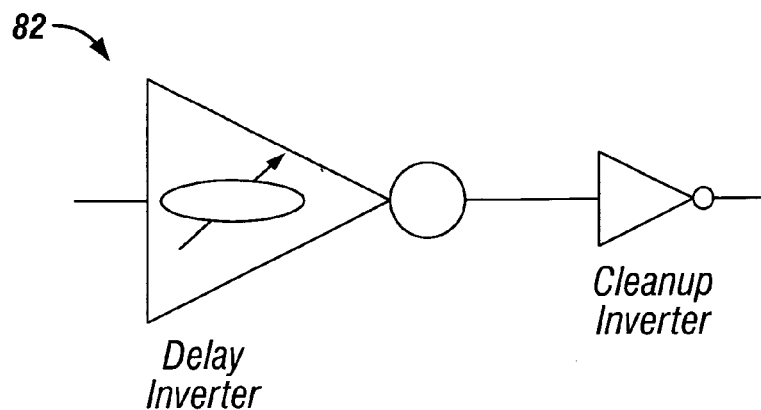
FIG. 4C is a symbolic circuit diagram of the delay structure shown in FIG. 4A.

FIGS. 4B and 4C show a timing diagram and a symbolic circuit representation, respectively, of the delay structure 82 in FIG. 4A. FIG. 4B, in particular, show how the presence of p-channel floating-gate MOSFET structure 84 allows the slew rate of the output of the delay structure to be adjusted according to the amount of charge Q stored on the floating gate 88. Adjusting the slew rate alters the time at which a subsequent circuit (e.g. cleanup inverter 94) triggers in response to the output provided by delay structure 82. As shown in the timing diagram, when a nominal Q is stored on floating gate 88, the slew rate remains unchanged and no delay is affected. However, as the charge Q is increased the slew rate decreases, thereby effecting increasing delays from node A and the output of cleanup inverter 94.

Figure 5A:
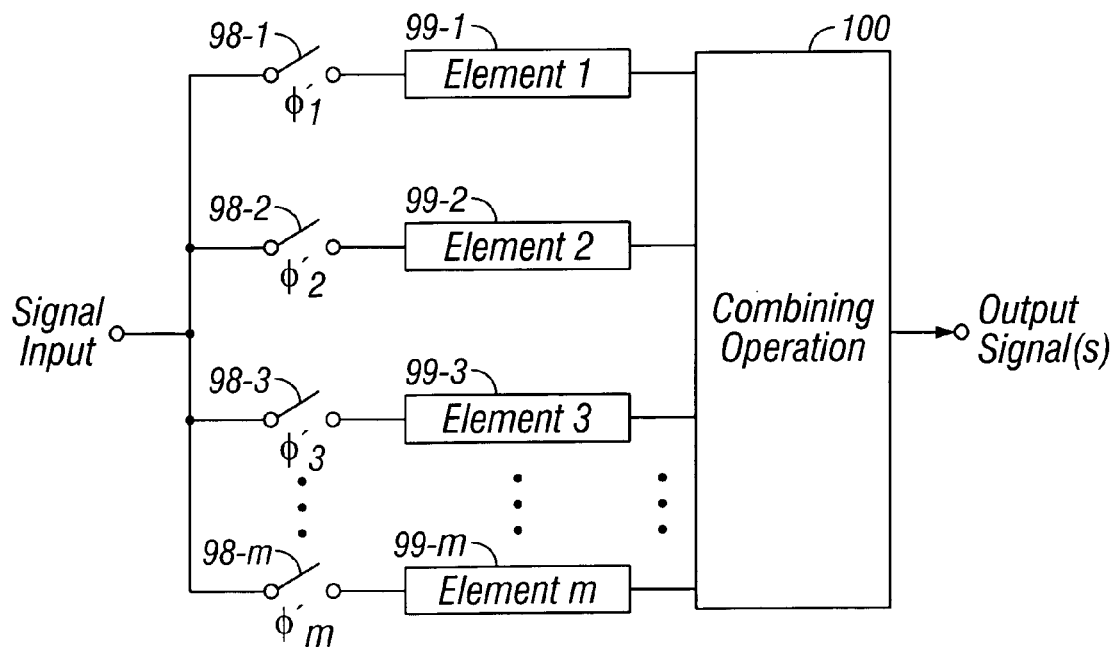
FIG. 5A is a simplified circuit diagram of a time-interleaved system that is controlled by time-matched clock signals $\phi_1'$, $\phi_2'$, $\phi_3'$, . . . ,$\phi_m'$.
Figure 5B:
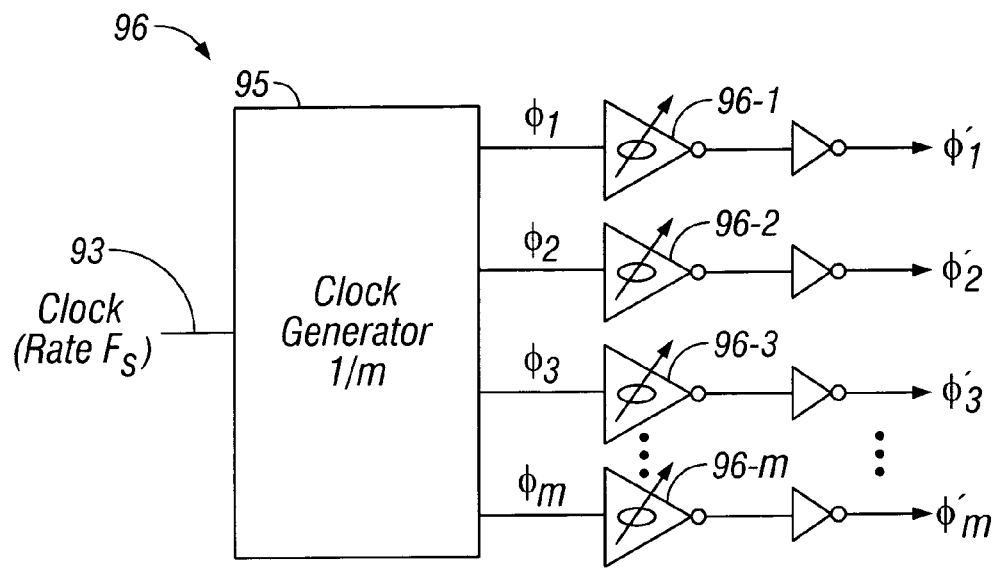
FIG. 5B shows how delay structures like the delay structure shown in FIGS. 4A–4C can be used to generate the time-matched clock signals $\phi_1'$, $\phi_2'$, $\phi_3'$, . . . ,$\phi_m'$ for the interleaved system shown in FIG. 5A, according to an embodiment of the present invention.

The delay structure 82 may be used to implement delays at various positions in time-interleaved or pipelined systems, according to embodiments of the present invention. FIGS. 5A and 5B show how m delay structures (m being an integer that is greater than or equal to 2) may be used to correct timing mismatches in clock signals $\phi_1, \phi_2, \phi_3, \ldots, \phi_m$ signals used in a time-interleaved system 96, according to an embodiment of the present invention. According to this embodiment of the invention, a clock generator 95 accepts an input clock 93 and provides output clocks $\phi_1, \phi_2, \phi_3, \ldots, \phi_m$ that are intended to be offset from one another by 360°/m. Because of delay mismatches in circuitry of clock generator 95, $\phi_1, \phi_2, \phi_3, \ldots, \phi_m$ may not be separated by precisely 360°/m. Delay structures 96-1, 96-2, 96-3, ... ,96-m are used to adjust the delays among clock signals $\phi_1, \phi_2, \phi_3, \ldots, \phi_m$ and provide time-matched clock signals $\phi_1', \phi_2', \phi_3', \ldots, \phi_m'$. Time-matched clock signals are then used to control the opening and closing of switches 98-1, 98-2, 98-3, ... ,98-m so that elements 99-1, 99-2, 99-3, ... ,99-m and subsequently combining operator 100 receive and transmit data in a time-matched manner. The trimming process just described (and, indeed, all the trimming processes described throughout this disclosure) can be performed during normal operation of time-interleaved system 96, so that mismatch errors due to, for example, temperature and aging, can be corrected.

Figure 6A:
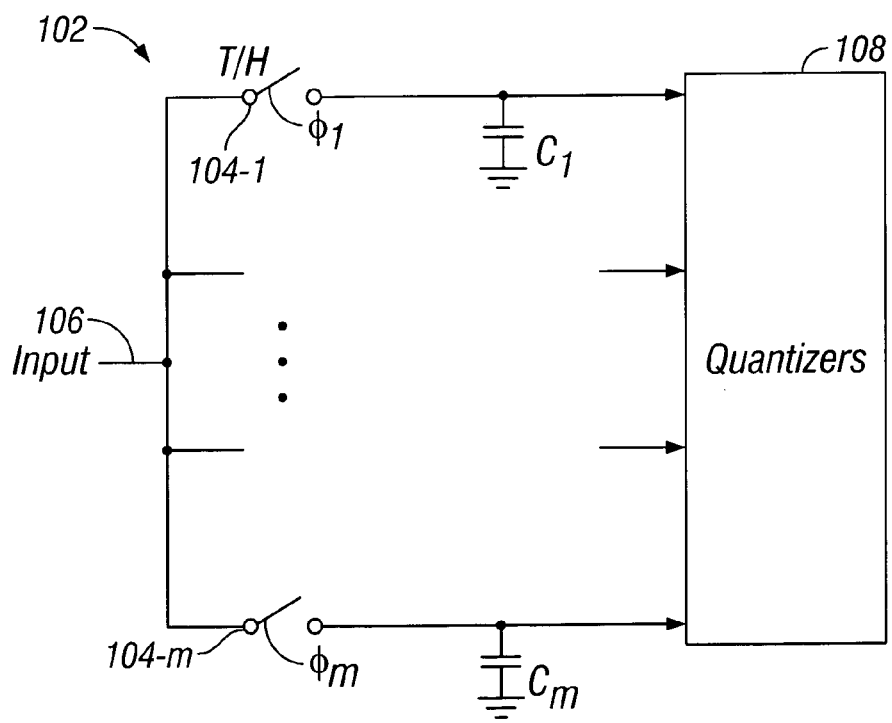
FIG. 6A is a simplified schematic diagram of an interleaved track-and-hold (T&H) circuit in an interleaved analog-to-digital converter (ADC)

FIG. 6A shows a prior art ADC 102 that utilizes multiple track-and-hold (T&H) circuits 104-1, ... ,104-m, where m is an integer that is greater than or equal to 2. T&H circuits 104-1, ... ,104-m capture an analog signal applied to an input 106 of ADC 102 and by operation of multiple quantizers 108 convert the analog signal into digital words. Each of the T&H circuits 104-1, ... ,104-m operates at a rate of 1/m times the composite sampling rate Fs.

Figure 6B:
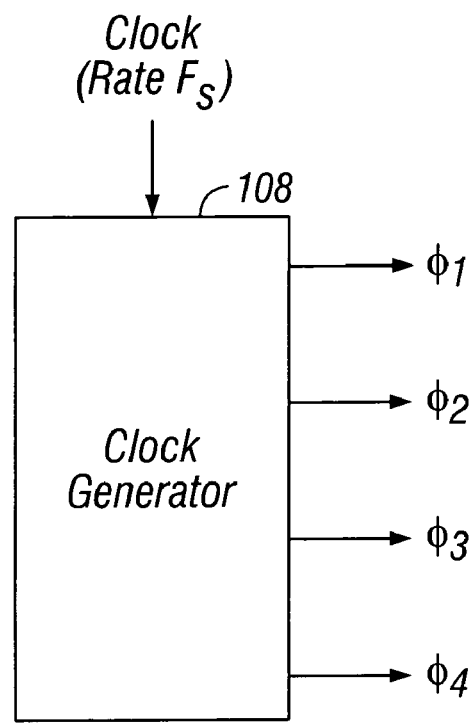
FIG. 6B is a block diagram of a clock generator that provides four clock signals, $\phi_1$, $\phi_2$, $\phi_3$ and $\phi_4$, which are ideally successively phased by 90 degrees.

In order for ADC 102 in FIG. 6A to capture and convert the analog input signal accurately operation of T&H circuits 104-1, ... ,104-m should be synchronized as best as possible. FIG. 6B shows a prior art clock generator 108 that generates sampling clock signals $\phi_1, \phi_2, \phi_3$ and $\phi_4$, which can be used for an m=4 time-interleaved ADC. Ideally, the phases of sampling clock signals $\phi_1, \phi_2, \phi_3$ and $\phi_4$ are offset by 360°/m relative to each other, to form equally spaced sampling instants at a rate of Fs/m. Using interleaving, ADC 102 samples the input at a rate of Fs by the individual T&H circuits 104-1, ... ,104-m sampling at a rate of Fs/m.

Figure 6C:
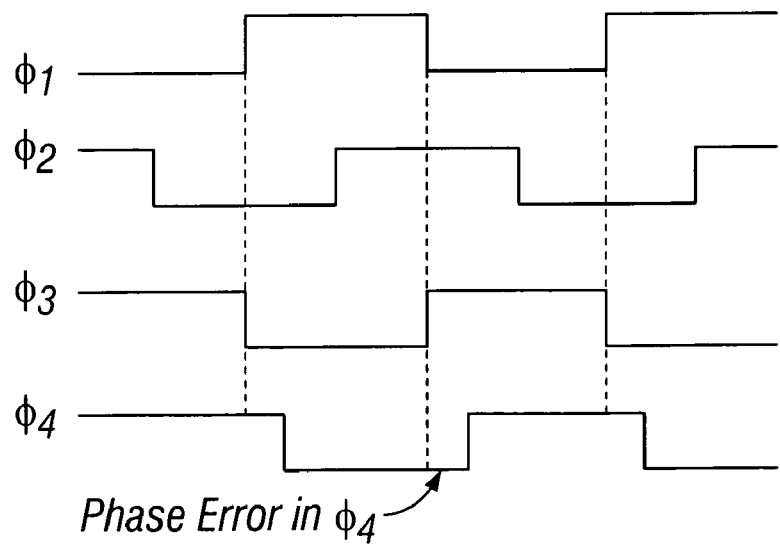
FIG. 6C is a timing diagram of the four clock signals, $\phi_1$, $\phi_2$, $\phi_3$ and $\phi_4$, generated by the clock generator shown in FIG. 6B, illustrating a timing error of clock signal $\phi_4$ relative to the other clock signals $\phi_1$, $\phi_2$ and $\phi_3$.

FIG. 6C shows a timing diagram of clock signals $\phi_1, \phi_2, \phi_3$ and $\phi_4$ when imperfections in the circuitry of the clock generator 108 (or other associated circuitry that may interfere with proper timing among clock signals $\phi_1, \phi_2, \phi_3$ and $\phi_4$) can produce a phase error in clock signal $\phi_4$, relative to the other clock signals $\phi_1, \phi_2$ and $\phi_3$.

Figure 6D:
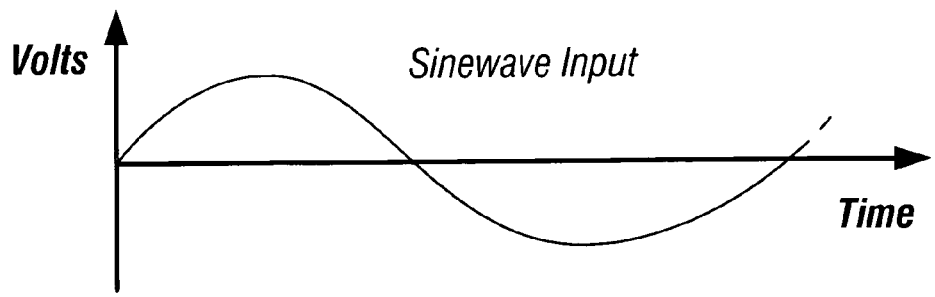
FIG. 6D is a timing diagram of an exemplary input signal for the interleaved ADC shown in FIG. 6A.
Figure 6E:
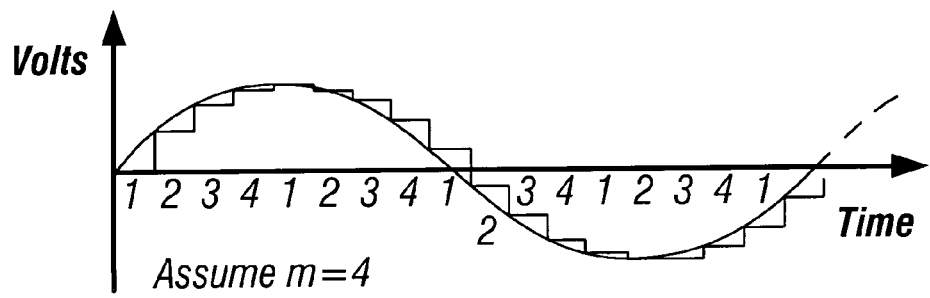
FIG. 6E is a timing diagram showing samples taken by the interleaved T&H in the ADC circuit shown in FIG. 6A when there are no timing errors among clock signals $\phi_1$, $\phi_2$, $\phi_3$ and $\phi_4$.
Figure 6F:
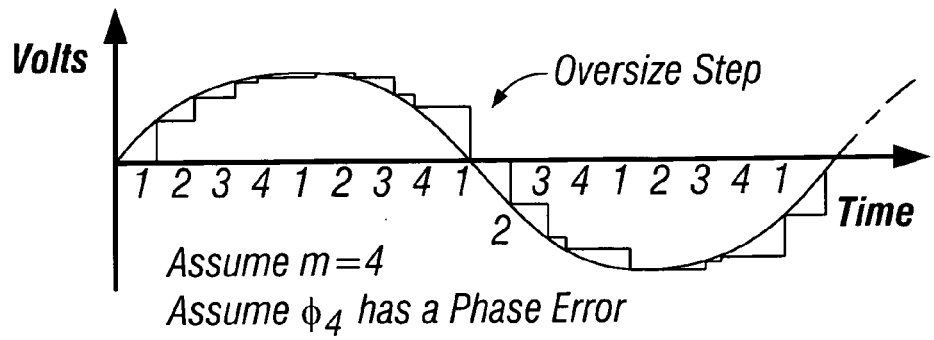
FIG. 6F is a timing diagram showing how a sampling error, shown as an oversize step, may be produced by the interleaved T&H in the ADC shown in FIG. 6A when clock signals having a timing error like that shown in FIG. 6C are present.

FIG. 6D shows a timing diagram of an exemplary analog input signal that can be applied to analog input 106 of the ADC in FIG. 6A. So long there are no timing discrepancies among clock signals $\phi_1, \phi_2, \phi_3$ and $\phi_4$, T&H circuits 104-1, ... ,104-m produces evenly spaced samples, as shown in FIG. 6E. However, if there is a timing mismatch among clock signals $\phi_1, \phi_2, \phi_3$ and $\phi_4$, an undersized or oversized sample may occur, as shown in FIG. 6F. FIGS.

Figure 7A:
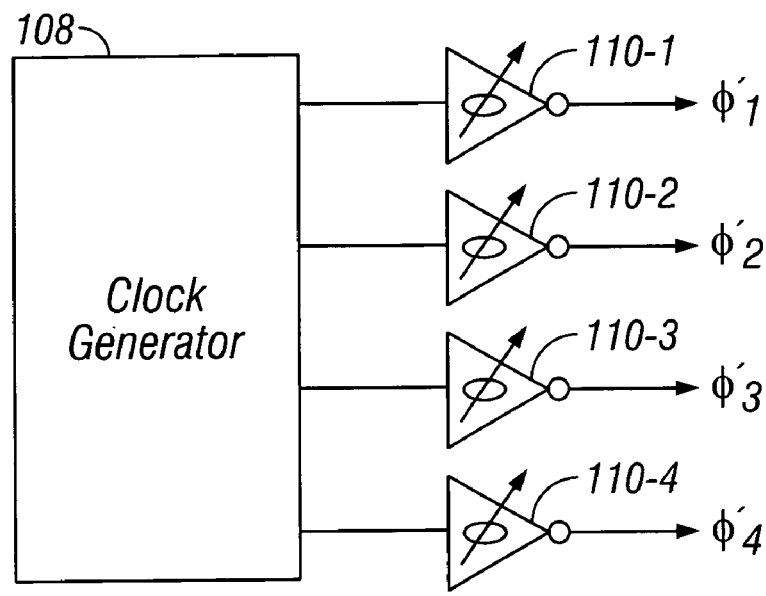
FIG. 7A is a block diagram showing how timing errors among the clock signals $\phi_1$, $\phi_2$, $\phi_3$ and $\phi_4$ of the clock generator shown in FIG. 6B can be corrected using delay structures like the delay structure shown in FIGS. 4A–4C, according to an embodiment of the present invention.
Figure 7B:
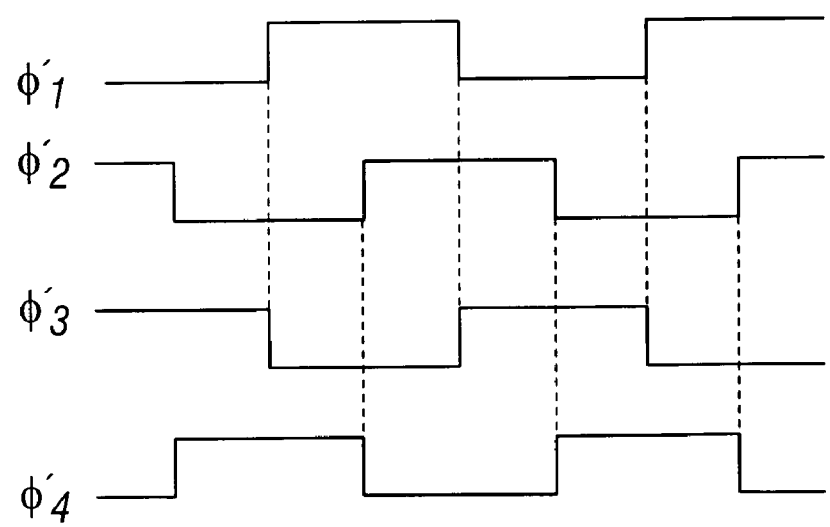
FIG. 7B is a block diagram showing the corrected clock signals $\phi_1$, $\phi_2$, $\phi_3$ and $\phi_4$ provided by the clock generator FIG. 7A, according to an embodiment of the present invention.

FIG. 7A is a block diagram showing how timing errors among the sampling clock signals $\phi_1, \phi_2, \phi_3$ and $\phi_4$ of the clock generator 108 shown in FIG. 6B can be corrected using delay structures 110-1, 110-2, 110-3 and 110-4, like the delay structures shown in FIGS. 4A–4E, according to an embodiment of the present invention. As shown in FIG. 7B, use of delay structures 110-1, 110-2, 110-3 and 110-4 corrects timing mismatches among sampling clock signals $\phi_1, \phi_2, \phi_3$ and $\phi_4$, to produce time-matched sampling clock signals $\phi_1', \phi_2', \phi_3', \ldots, \phi_m'$ signals.

Figure 8A:
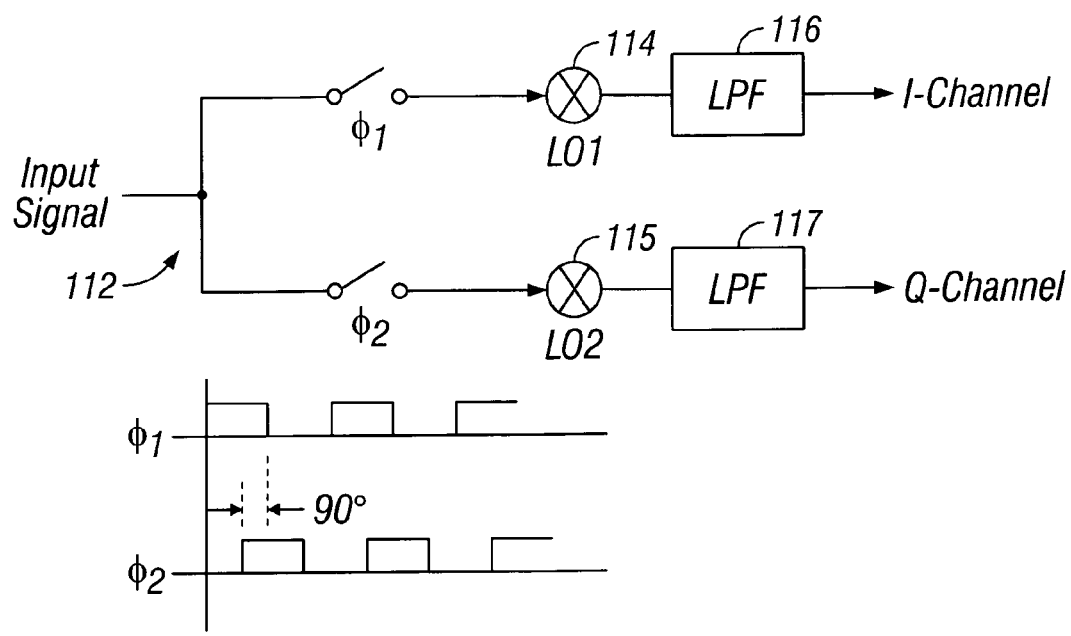
FIG. 8A is simplified diagram of a prior art quadrature mixing circuit and accompanying timing relationship between signals $\phi_1$ and $\phi_2$.
Figure 8B:
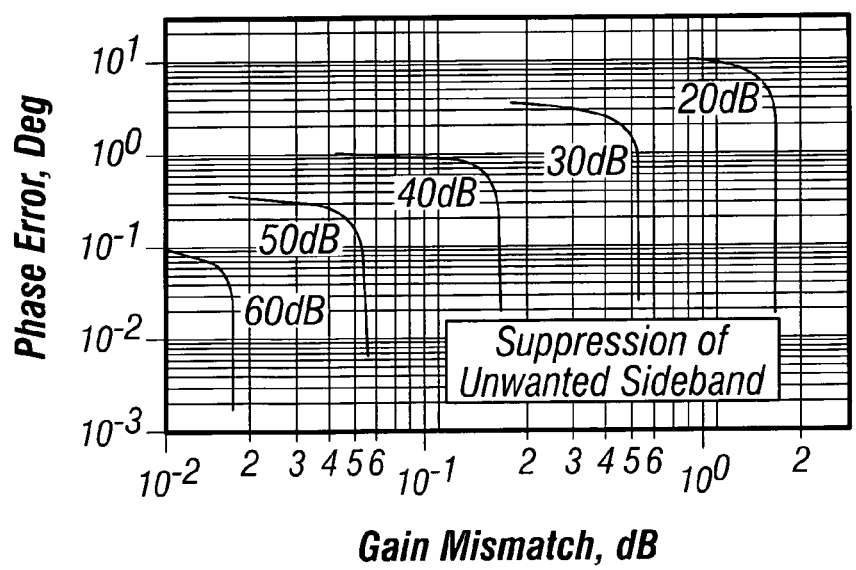
FIG. 8B is a graph illustrating the increasing inability of the quadrature mixing circuit in FIG. 8A to suppress unwanted sideband signals as phase and gain mismatch errors increase.

FIG. 8A shows a quadrature mixer circuit 112 that utilizes two local oscillator signals, $\phi_1$ and $\phi_2$ to generate in-phase (I) and quadrature phase (Q) channels in, for example, a radio frequency (RF) receiver. Ideally, local oscillator signals, $\phi_1$ and $\phi_2$ are ninety degrees out of phase and the I and Q channels have identical gains. In practice however, timing and gain mismatches between the I and Q channels are observed. As shown in FIG. 8B, these timing and gain mismatches result in unwanted sideband signals, which can limit the dynamic range of the mixer circuit.

According to an embodiment of the present invention, delay structures, like the delay structures shown in FIGS. 4A–4C, or equivalent structures, can be used to correct for timing mismatches between local oscillator signals $\phi_1$ and $\phi_2$ of the I and Q channels of quadrature mixer circuit 112. This can be accomplished by inserting delay structures at the outputs of the clock generator that generates local oscillator signals $\phi_1$ and $\phi_2$ (similar to that described above in relation to FIGS. 5B and 7A. Additionally, gain mismatch errors may also be reduced using floating-gate adjustments, e.g. similar to as done to FIG. 12A, to further improve the mixer's dynamic range.

Figure 1:
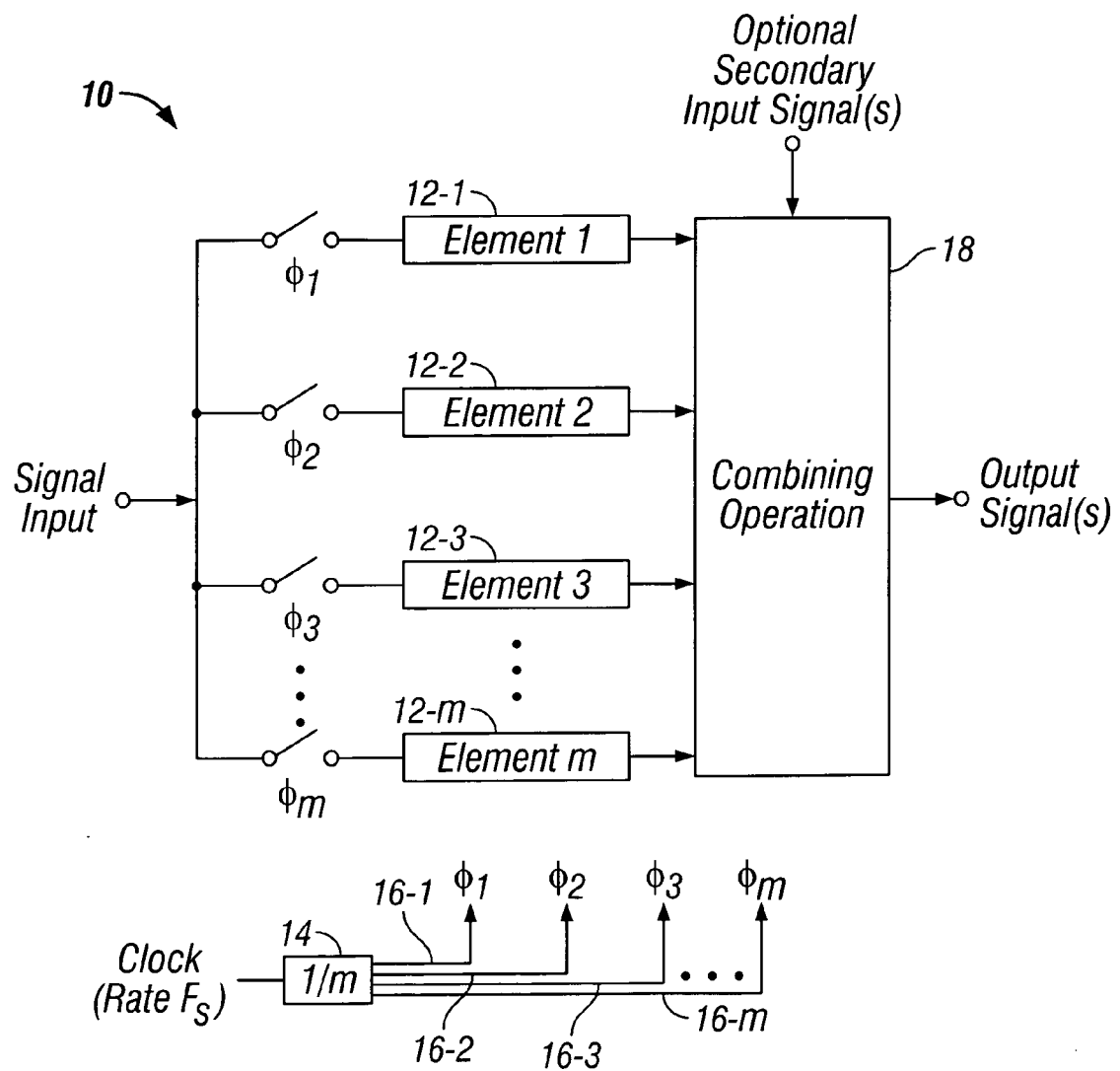
FIG. 1 is a block diagram of a prior art time-interleaved system.
Figure 2:
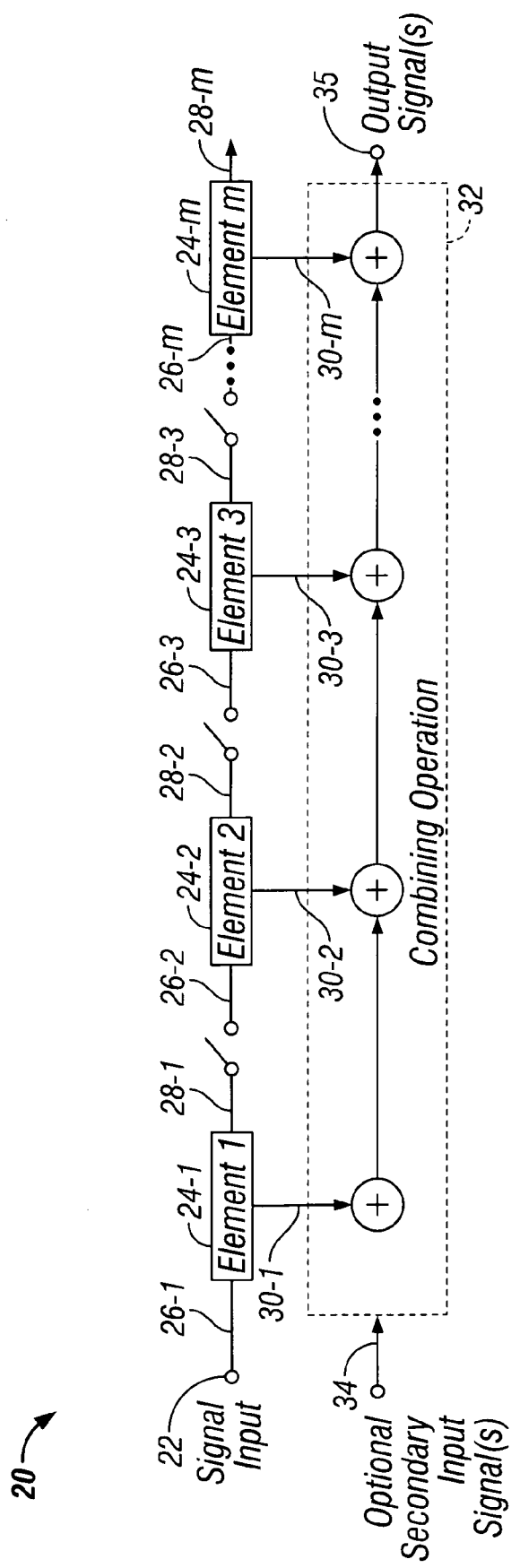
FIG. 2 is a block diagram of a prior art pipelined system.
Figure 9A:
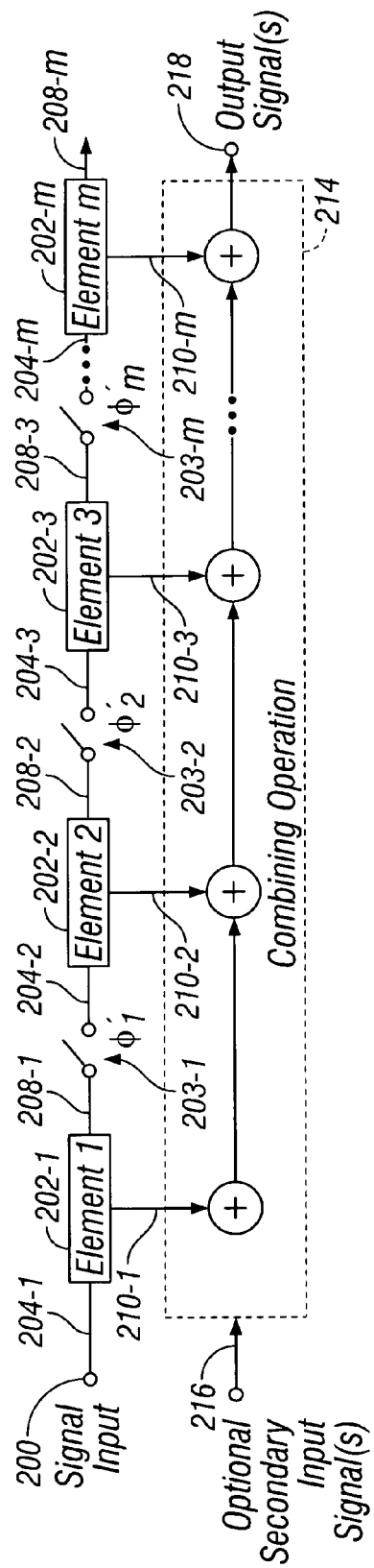
FIG. 9A is a simplified circuit diagram of a pipelined system using delay structures like the delay structure shown in FIGS. 4A–4C, according to an embodiment of the present invention.

FIG. 9A shows a pipelined system that is capable of processing an input signal into one or more output signals, according to an embodiment of the present invention. In contrast to the prior art pipelined system described in connection with FIG. 2 above, the pipelined system in FIG. 9A is controlled by a clock generator that provides clock signals, $\phi_1'$, $\phi_2'$, ..., $\phi_m'$. Clock signals $\phi_1'$, $\phi_2'$, ..., $\phi_m'$ time the sampling of outputs of the pipelined processing elements 202-1, 202-2, 202-3, ..., 202-m in a successive manner, as indicated by switches 203-1, 203-2, ..., 203-m. By successively sampling the output of a previous processing element, a subsequent processing element performs its desired operation. As described in more detail in connection with FIG. 9B below, one or more of the clock signals, $\phi_1'$, $\phi_2'$, ..., $\phi_m'$ are produced by delaying one or more of source clock signals, $\phi_1, \phi_2, ..., \phi_m$.

As shown in FIG. 9A, a signal is received at an input node 200 and sequentially processed by m processing elements 202-1, 202-2, 202-3, ..., 202-m. Processing elements 202-1, 202-2, 202-3, ..., 202-m have associated inputs 204-1, 204-2, 204-3, ..., 204-m and associated outputs 208-1, 208-2, 208-3, ..., 208-m, each output of which is cascaded into a next element's input. Optional combinational outputs 210-1, 210-2, 210-3, ..., 210-m may also be coupled to a combining operation 214, which may have additional secondary inputs 216. The pipelined system may also have one or more feedback or feedforward loops and may output one or more outputs at output node 218.

Figure 9B:
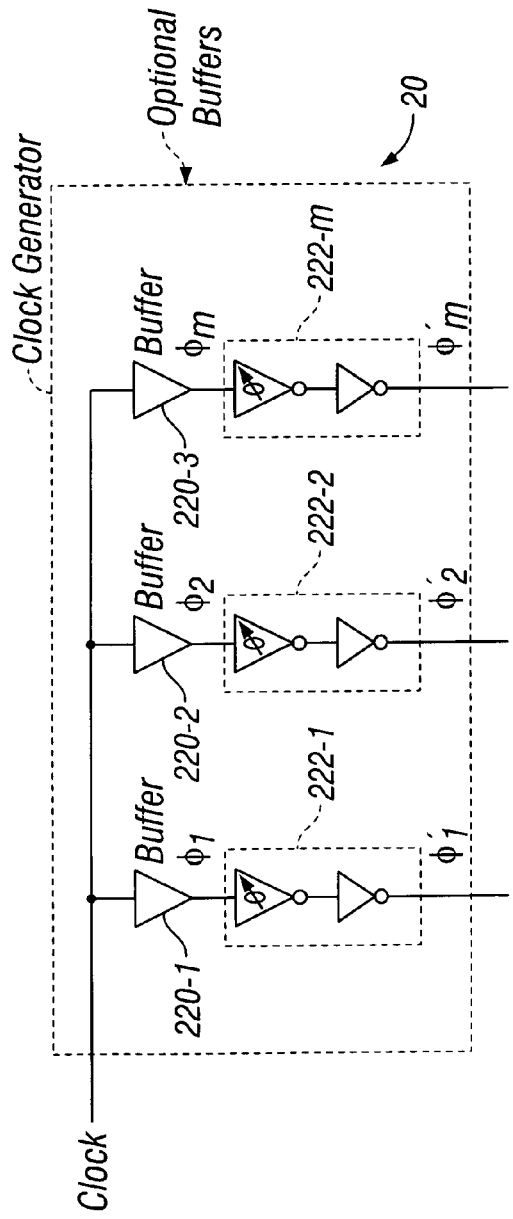
FIG. 9B shows a clock generator circuit that can be used to control the timing of the pipelined system shown in FIG. 9A, according to an embodiment of the present invention.

FIG. 9B shows a clock generator circuit that can be used to control the timing of the pipelined system shown in FIG. 9A, according to an embodiment of the present invention. The clock generator circuit provides source clock signals, $\phi_1, \phi_2, ..., \phi_m$ from a single source clock, CLOCK, via optional buffers 220-1, 220-2, ..., 220-m. Delay structures 222-1, 222-2, ..., 222-m of or equivalent to the delay structures described in FIGS. 4A-C are utilized to generate the clock signals $\phi_1'$, $\phi_2'$, ..., $\phi_m'$. Each of the delay structures 222-1, 222-2, ..., 222-m in FIG. 9B has a floating-gate transistor element with a floating gate. Charge on the floating gates may be modified to affect the relative delay among clock signals $\phi_1'$, $\phi_2'$, ..., $\phi_m'$ as they are applied to the pipelined system in FIG. 9A. Adjusting the delays allows proper sampling instants along the pipeline processing elements 202-1, 202-2, 202-3, ..., 202-m.

Figure 10A:
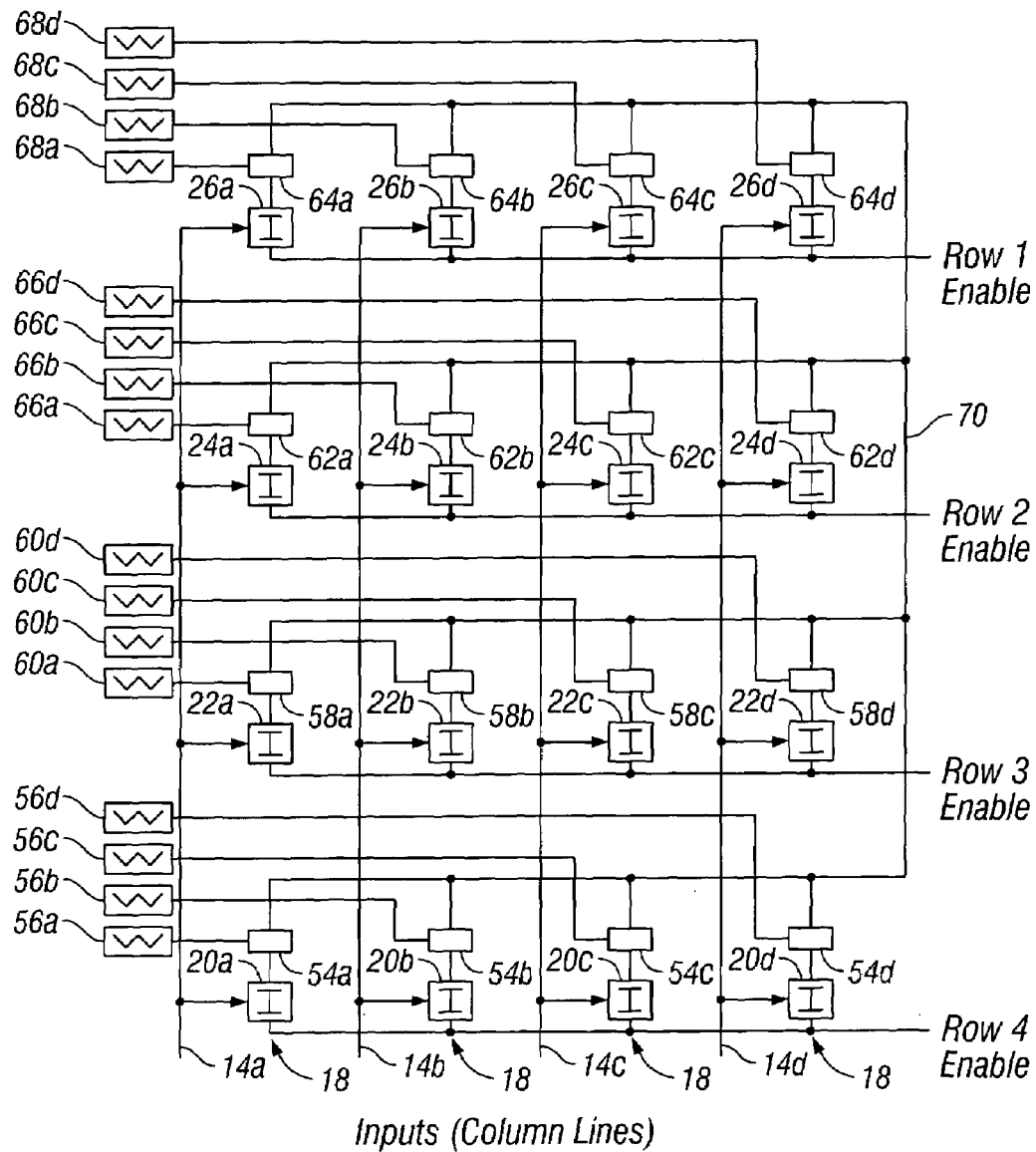
FIG. 10A is a prior art block diagram of a multistage rotating-buffer processing system that may implement digital signal processing functions such as, for example, a finite-impulse-response (FR) filter.

FIG. 10A shows a prior art block diagram (FIG. 2a of U.S. Pat. No. 5,270,963) of a plurality of rotating buffers and associated processing circuitry that can be adapted for implementing various signal processing functions such as, for example, an analog finite impulse response (FIR) filter.

The block diagram, with its original reference indicators shown, comprises a plurality of multi-stage buffers 18 that are associated with column lines 14a, 14b, 14c and 14d. Each multi-stage buffer 18 is shown as having four stages 20a–d, 22a–d, 24a–d and 26a–d, each of which is an analog latch, including an input, an output, and an enable input.

Figure 10B:
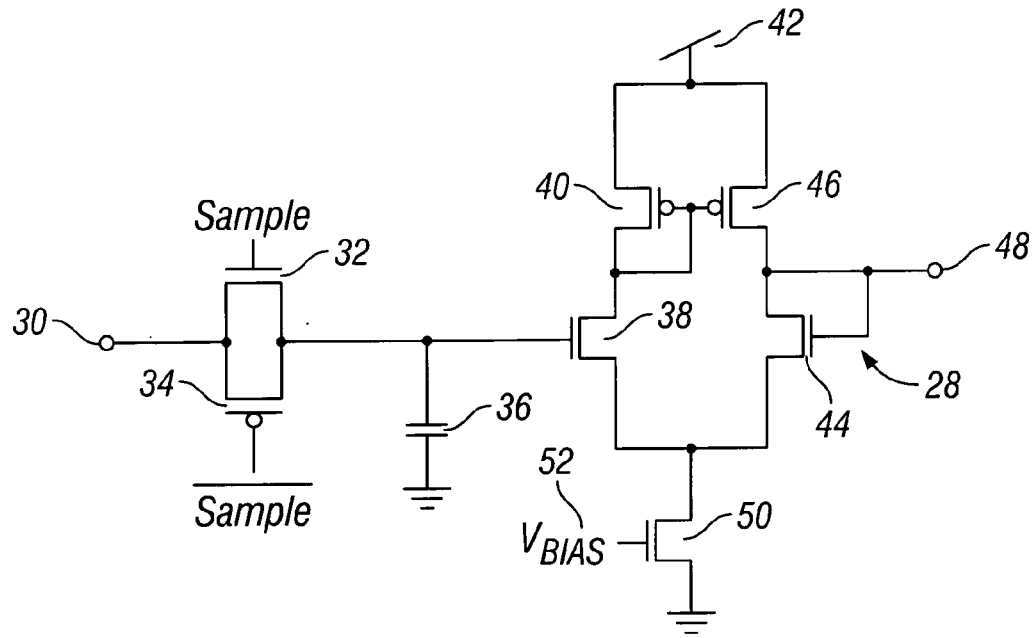
FIG. 10B is a prior art analog latch that can be used in the rotating-buffer processing system shown in FIG. 10A.

FIG. 10B shows a prior art analog latch (FIG. 2b of U.S. Pat. No. 5,270,963, with the original reference indicators shown) that can be used in FIG. 10A. An analog value of the signal presented to each analog latch 20a–d, 22a–d, 24a–d and 26a-d on column lines 14a–d, respectively, is captured and appears at the output of the analog latches in a particular row, in response to a signal on their enable inputs. Similar to the T&H ADC shown in FIG. 6A, the analog latches 20a–d, 22a–d, 24a–d and 26a–d capture an analog signal at equally spaced sampling instants. Unlike the ADC, however, this system is not subsampled. Rather, the analog latches 20a–d, 22a–d, 24a–d and 26a–d capture successive instances of the analog input, with earlier samples representing "delayed" versions of the input. The barrel shifter rotates these time samples to the analog multipliers, such that each increment of 360°/n in the rotation (where n is the number of taps in the barrel shifter) applies a successively delayed version of the analog input to any given multiplier. The combined analog latch/barrel-shifter/analog-multiplier forms an analog implementation of the well-known FIR filter used in digital signal processing.

Figure 11A:
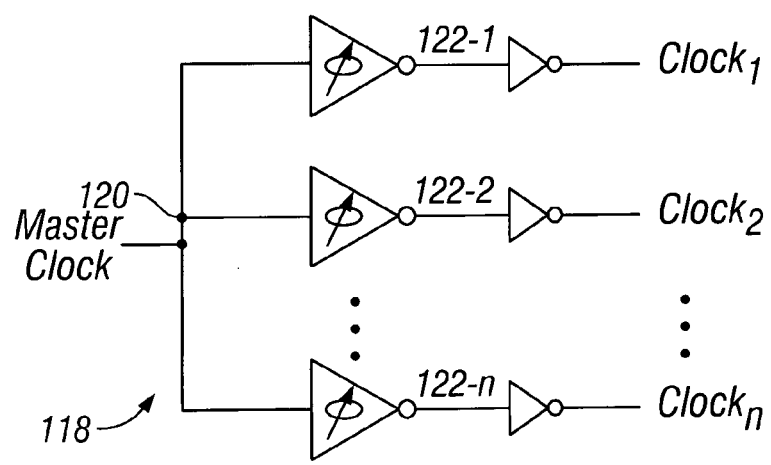
FIG. 11A shows how the delay structures shown in FIGS. 4A–4C may be used to correct timing errors among the sampling instants of analog latches of the type shown in FIG. 10B to guarantee proper timing of processing functions performed by the rotating-buffer processing system shown in FIG. 10A, according to an embodiment of the present invention.
Figure 11B:
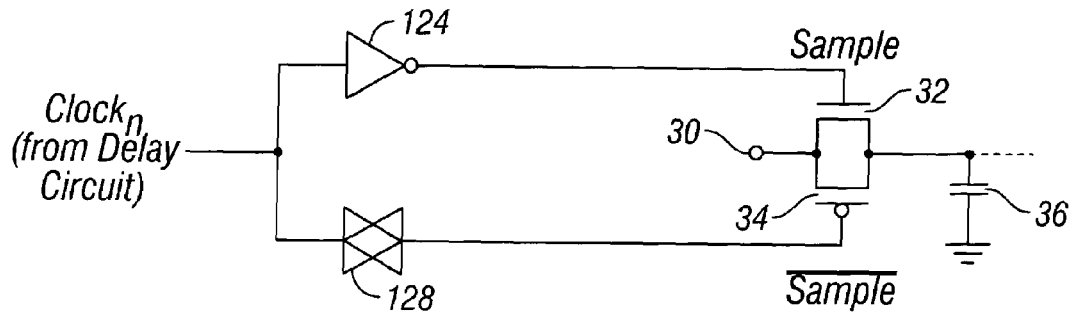
FIG. 11B shows a single analog latch configured to accept a corrected clock signal from the circuit shown in FIG. 11A, according to an embodiment of the present invention.

For the system in FIG. 10A to perform accurately, the enabling signal applied to a given row of the system should be properly displaced relative to the enabling signal of other rows. FIG. 11A shows a delay circuit 118 that has a master clock input 120 configured to accept a master clock. Master clock input 120 is coupled to the inputs of a plurality of delay structures 122-1, 122-2, ..., 122-n (where n is an integer and represents the number of rows in the system. Delay structures like that shown in FIGS. 4A–4C, or equivalent structures, may be used to implement delay structures 122-1, 122-2, ..., 122-n. By adding and/or removing charge from the floating gates of each delay structure 122-1, 122-2, ..., 122-n, the timing among clock signals clock1, clock2, ..., clockn can be corrected and matched. As shown in FIG. 11B, each of these corrected clock signals clock1, clock2, ..., clockn can be coupled to the SAMPLE inputs (via optional inverter 124) and to the $\overline{\text{SAMPLE}}$ inputs (via an optional pass gate 128) of latches in an associated row of the prior art system shown in FIG. 10A, to improve time-matching among the n rows of the system.

Figure 12A:
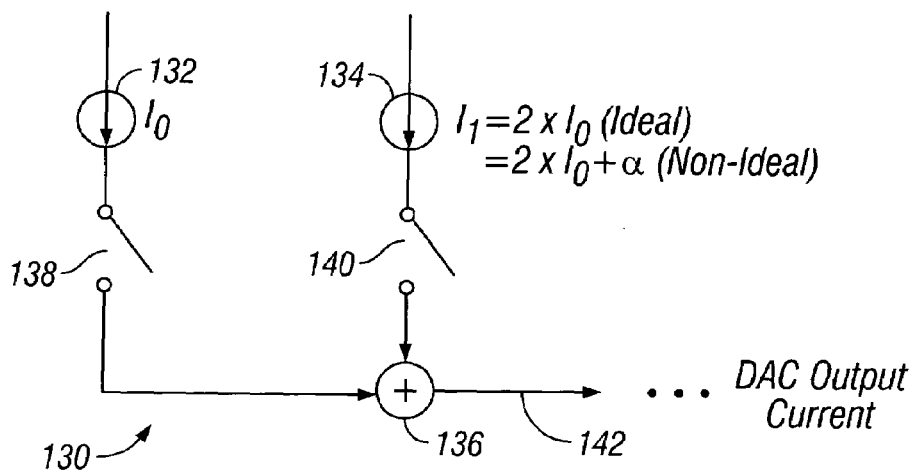
FIG. 12A is a simplified electrical schematic diagram of a portion of a prior art current-steering digital-to-analog converter (DAC) having switches controlled by clock signals $\phi_1$ and $\phi_2$.

In addition to using the floating-gate MOSFET structures in FIGS. 3A–3E to implement signal delays and correct for clock timing mismatches, the floating-gate MOSFET structures can be used to reduce gain mismatches among signal pathways in time-interleaved and pipelined systems. FIG. 12A shows a portion of a prior art current-steering digital-to-analog converter (DAC) 130, which can be used to illustrate the effect of gain mismatch in a time-interleaved system. In this simplified 2-bit example, two current sources 132 and 134 provide fixed currents $I_0$ and $I_1$, which are summed by a summer 136, via switches 138 and 140, at appropriate instants in time to approximate a sine wave at an output 142 of the DAC 130. Digital input signals $\phi_1$ and $\phi_2$ control the opening and closing of switches 138 and 140. Ideally, the magnitude of $I_1$ is twice the magnitude of $I_0$. In practice, however, this relationship between the two currents is not satisfied because of gain mismatches between the two current sources 132 and 134. For example, as shown in FIG. 12A, current source 134 may provide a current of $2I_0+\alpha$, rather than the intended $2I_0$, where α represents an error current caused by gain mismatch.

Figure 12B:
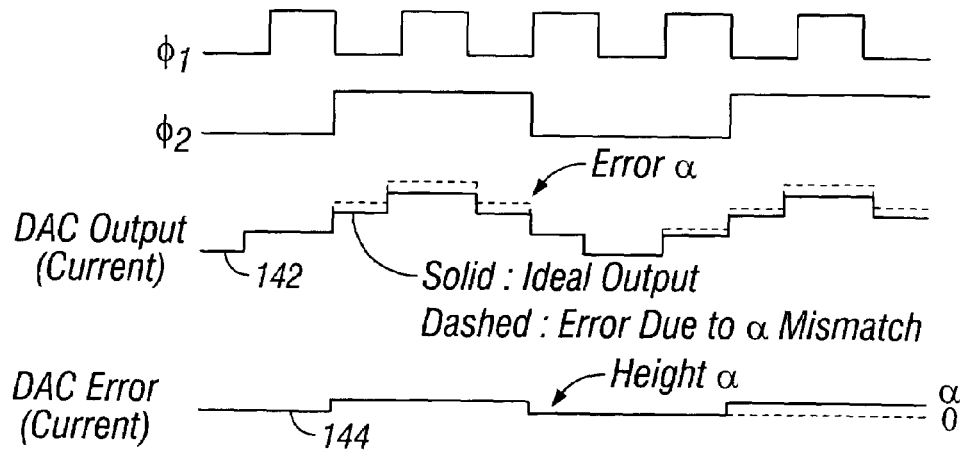
FIG. 12B is a timing diagram of the prior art DAC in FIG. 12A, illustrating how gain mismatch between transistors in the two current sources $I_0$ and $I_1$ can result in errors in the intended output.

FIG. 12B shows a composite output waveform 142 of DAC 130 that is produced in response to DAC input signals $\phi_1$ and $\phi_2$, both with and without gain mismatch. The solid lines in the composite output waveform 142 represent the ideal situation, i.e. where $I_1=2\times I_0$. The dashed lines show how the output is corrupted due to gain mismatch between current sources 132 and 134. The error current 144 always exists unless the current sources are perfect multiples of a base value $I_0$.

Figure 13:
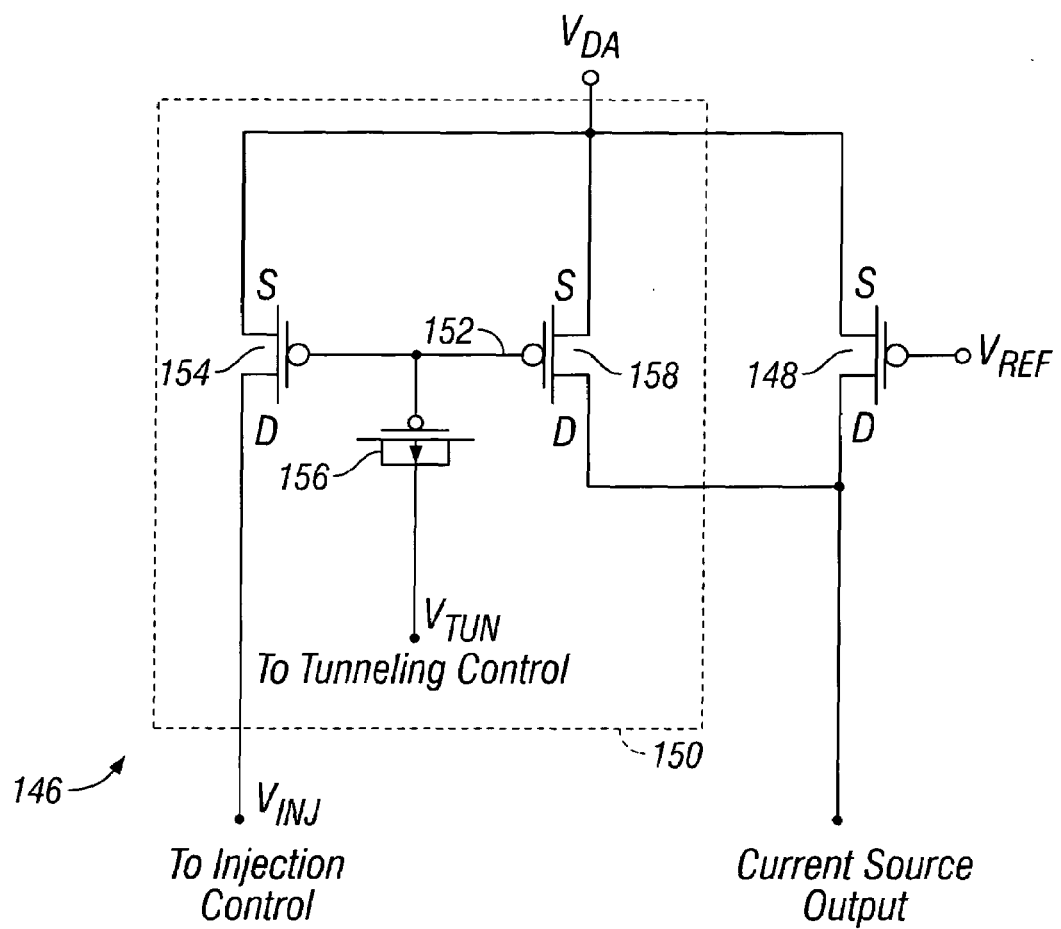
FIG. 13 shows an embodiment of a current source $I_0$ or $I_1$ from the DAC of FIG. 12A, showing how the p-channel floating-gate MOSFET structure in FIG. 3E may be used to trim the current source, according to an embodiment of the present invention.

According to an embodiment of the present invention, floating-gate MOSFET structures, like those shown in FIGS. 3A–3E, can be used to trim current sources 132 and/or 134 to reduce errors caused by mismatch and/or to adjust the gain(s) of the current sources 132 and/or 134. FIG. 13 shows an example of a trimmable current source 146, which can be used in replace of current sources 132 and/or 134 in FIG. 12A, to reduce mismatches between current sources. Trimmable current source 146 comprises a current source 148 and a trim device 150. Trim device 150, which is equivalent to the floating-gate MOSFET structure 70 shown in FIG. 3E above, comprises a floating gate 152, an injection device 154 coupled to floating gate 152, and a tunneling device 156 coupled to floating gate 152. P-channel floating-gate MOSFET 158 adds a trim current to the current supplied by current source transistor 148. The amount of the trim current depends on the floating-gate voltage, which, in turn, depends on the amount of charge stored on floating gate 152. Charge is added to floating gate 152 by connecting the drain of injection device 154 to an injection voltage $V_{INJ}$ that causes hot-electron injection onto floating gate 152. Charge is removed from floating gate 152 by raising a tunneling voltage $V_{TUN}$ sufficiently to cause electrons to tunnel off of floating gate 152 using a Fowler-Nordheim process. In an alternative embodiment the floating-gate MOSFET structure shown in FIG. 3D may be used as a trimmable current source, or may be used to add or remove charge to and from an additional current source circuit. Alternatively, trim device 150 could be used to source the entire current required, rather than just a portion of the total output current.

Figure 14A:
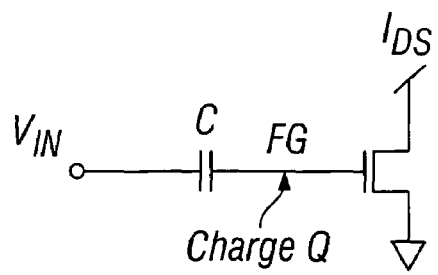
FIG. 14A shows how, in general, n-channel floating-gate MOSFET structures, or equivalent structures, can implement variable transconductance elements by adjusting the floating-gate charge Q.
Figure 14B:
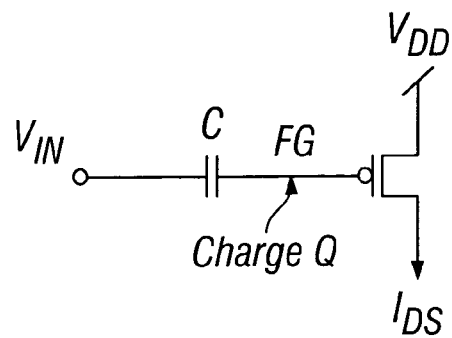
FIG. 14B shows how, in general, the p-channel floating-gate MOSFET structures shown in FIGS. 3A–3E, or equivalent structures, can implement variable transconductance elements by adjusting the floating-gate charge Q.
Figure 14C:
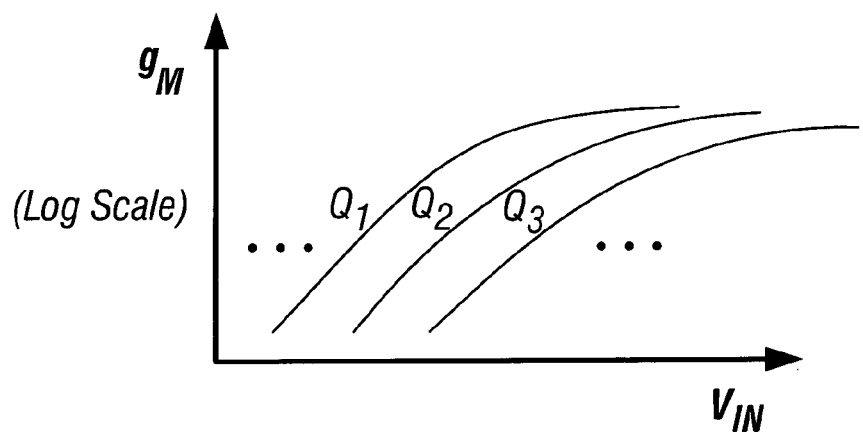
FIG. 14C is a graph illustrating how different charge storage levels on the floating gates of the transistor structures in FIGS. 14A and 14B affect the transconductance characteristics of the transistor structures.

FIG. 14A shows how, in general, the p-channel floating-gate MOSFET structures shown in FIGS. 3A–3E can be implemented as variable transconductance n-channel transistors. Similarly, FIG. 14B shows how, in general, the p-channel floating-gate MOSFET structures shown in FIGS. 3A–3E can be implemented as variable transconductance p-channel transistors. FIG. 14C is a graph illustrating how different charge storage levels on the floating gates of the transistor structures in FIGS. 14A and 14B affect the transconductance characteristics of the transistor structures. According to embodiments of the present invention, the transconductance transistor structures shown in FIGS. 14A and 14B can be used as trimming devices that can be used in the time-interleaved and pipelined structures described above to alleviate mismatches among signal pathways, either in conjunction with the delay structures described or independent of any delay structures.

Figure 15A:
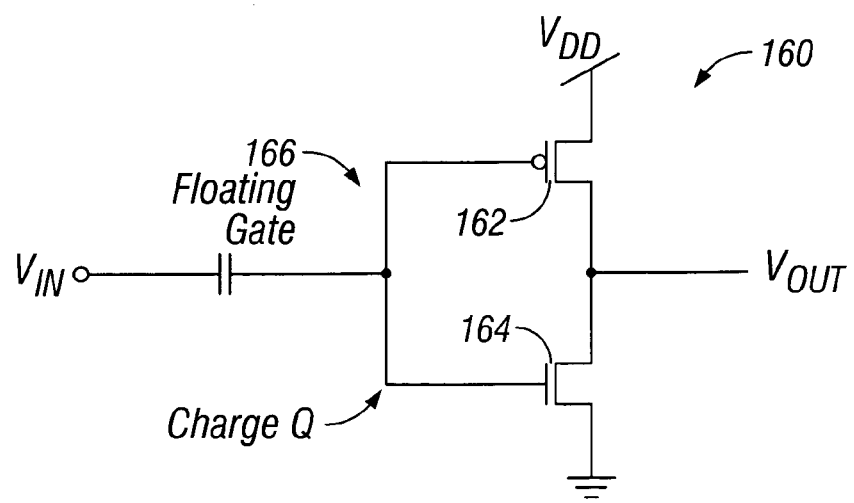
FIG. 15A shows how the floating-gate MOSFET structures shown in FIGS. 14A–14B, or equivalent structures, can be used to adjust the input offset of a CMOS inverter, according to an embodiment of the present invention.
Figure 15B:
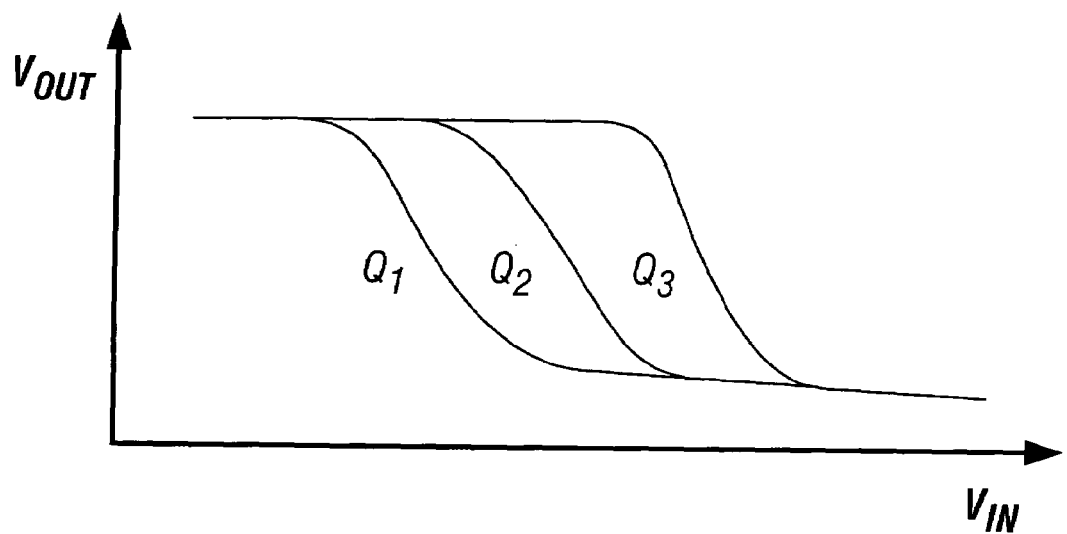
FIG. 15B is a graph showing how the transfer characteristics of the CMOS inverter in FIG. 15A vary according to how much charge is stored on the floating gate of the floating-gate MOSFETs.

FIG. 15A shows how the floating-gate MOSFET structures shown in FIGS. 3A–3E, or equivalent devices, can be used to adjust the input offset of a CMOS inverter 160, according to an embodiment of the present invention. CMOS inverter 160 comprises a p-channel floating-gate MOSFET 162 and an n-channel floating-gate MOSFET 164 with a common floating gate 166. Charge can be added or removed from floating gate 166, in the manner described above, to change the input offset of the inverter 160. FIG. 15B is a graph showing how the transfer characteristics of CMOS inverter 160 vary according to how much charge is stored on floating gate 166. According to embodiments of the present invention, trimmable CMOS inverter 160 can be used in the time-interleaved and pipelined structures described above to alleviate mismatches among signal pathways, either in conjunction with the delay structures described or independent of any delay structures.

Figure 16A:
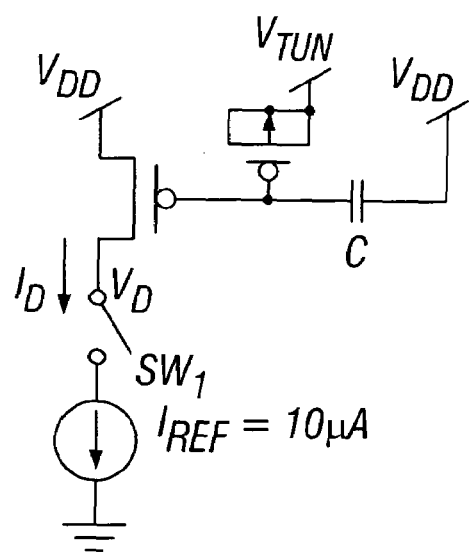
FIG. 16A shows how the floating-gate MOSFET structures shown in FIGS. 3A–3E, or equivalent structures, can be used to store a precision current.

FIG. 16A shows how the floating-gate MOSFET structures shown in FIGS. 3A–3E, or equivalent structures, can be used to store a precision current. The circuit of FIG. 16A is first removed of its floating gate charge by raising the tunneling junction $V_{tun}$ to a high voltage. Next, $SW_1$ is connected to the reference current source $I_{REF}$. Since there is little or no current in the pMOS transistor, its drain voltage falls, as depicted in FIG. 16B. This results in electrons being injected from the drain to the gate. As this process continues, the drain current increases while the drain voltage rises, as seen in FIG. 16B, until the current in the transistor equals the reference current. At this point, no more charge is injected onto the floating gate.

Figure 17C:
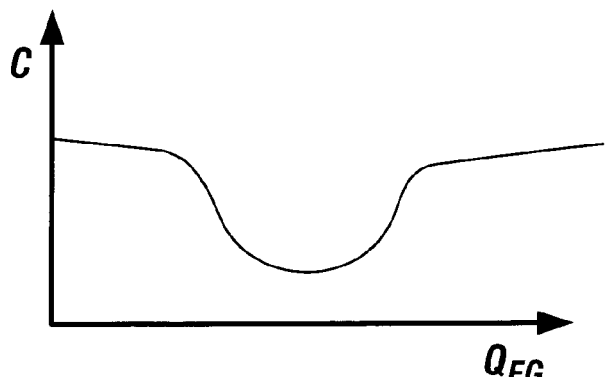
FIG. 17C illustrates how the capacitance of the trimmable capacitors in FIGS. 17A and 17B depends on the amount of charge $Q_{fg}$ stored on the floating gate of the transistors.

FIG. 17A shows how the p-channel floating-gate MOSFET structures shown in FIGS. 3A–3E, or equivalent devices, can be used to implement a trimmable capacitor. Similarly, FIG. 17B shows how n-channel floating gate MOSFET structures, or equivalent devices, can be used to implement a trimmable capacitor. As shown in FIG. 17C, the capacitance of the trimmable capacitors in FIGS. 17A and 17B depends on the amount of charge $Q_{fg}$ stored on the floating gate of the transistors. According to embodiments of the present invention, the trimmable capacitor structures in FIGS. 17A and 17B can be used in the time-interleaved and pipelined structures described above to alleviate mismatches among signal pathways, either in conjunction with the delay structures described or independent of any delay structures.

Figure 18A:
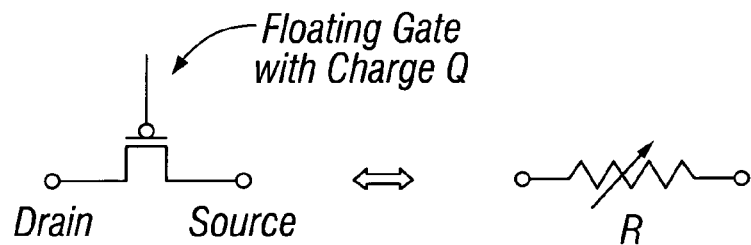
FIG. 18A shows how the p-channel floating-gate MOSFET structures shown in FIGS. 3A–3E, or equivalent structures, can be used to implement a trimmable resistor.
Figure 18B:
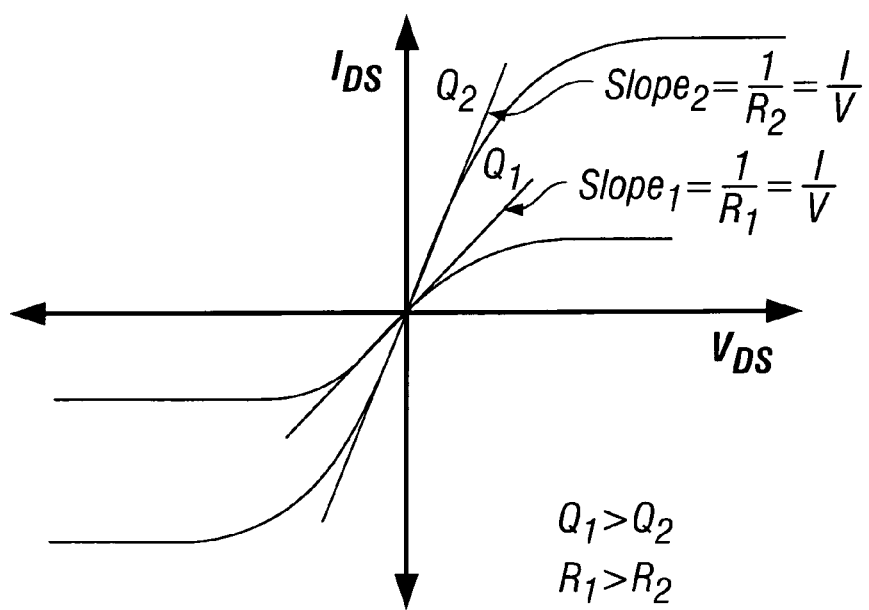
FIG. 18B illustrates how the resistance of the trimmable resistor in FIG. 18A depends on the amount of charge $Q_{fg}$ stored on the floating gate of the transistor.

FIG. 18A shows how the p-channel floating-gate MOSFET structures shown in FIGS. 3A–3E, or equivalent devices, can be used to implement a trimmable resistor. The MOSFET structure is biased in the triode region of the device's characteristic curves and presents a variable resistance depending on the amount of charge stored on the floating gate of the MOSFET. As shown in FIG. 18B, the resistance of the trimmable resistor in FIG. 18A depends on the amount of charge $Q_{fg}$ stored on the floating gate of the transistor. According to embodiments of the present invention, the trimmable resistor structure in FIG. 18A can be used in the time-interleaved and pipelined structures described above to alleviate mismatches among signal pathways, either in conjunction with the delay structures described or independent of any delay structures.

Figure 19A:
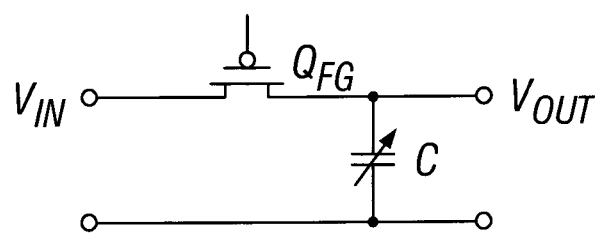
FIG. 19A illustrates how the p-channel trimmable resistor in FIG. 18A and/or how the trimmable capacitor structures in FIGS. 17A and 17B may be used to enable different filter time constants in a trimmable RC filter, or, alternatively, different signal delays in a signal-delay system.
Figure 19B:
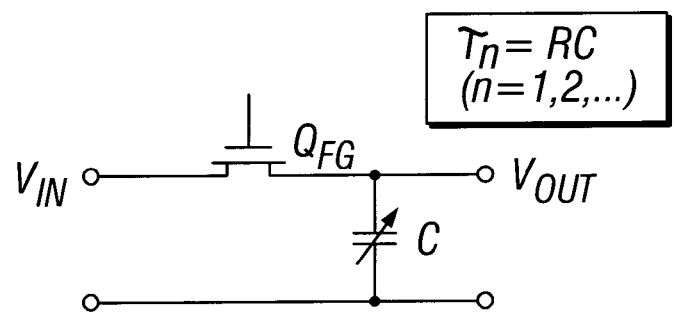
FIG. 19B illustrates how an n-channel floating-gate transistor can be used to form a trimmable resistor similar to that shown in FIG. 18A and/or how the trimmable capacitor structures in FIGS. 17A and 17B may be used to enable different time filter time constants in a trimmable RC filter.
Figure 19C:
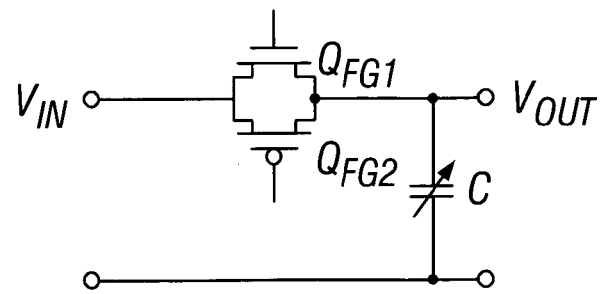
FIG. 19C illustrates how a parallel connection of the trimmable resistor structures in FIGS. 19A and 19B and/or how the trimmable capacitor structures in FIGS. 17A and 17B may be used to enable different filter time constants in a trimmable RC filter, or, alternatively, different signal delays in a signal-delay system.
Figure 19D:
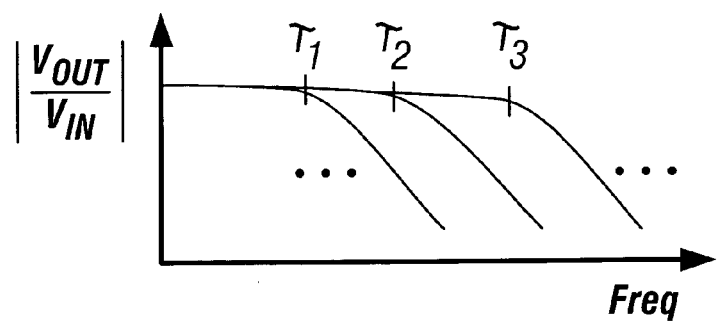
FIG. 19D is a graph showing the transfer characteristics versus frequency of the trimmable RC filters in FIGS. 19A–19C.
Figure 19E:
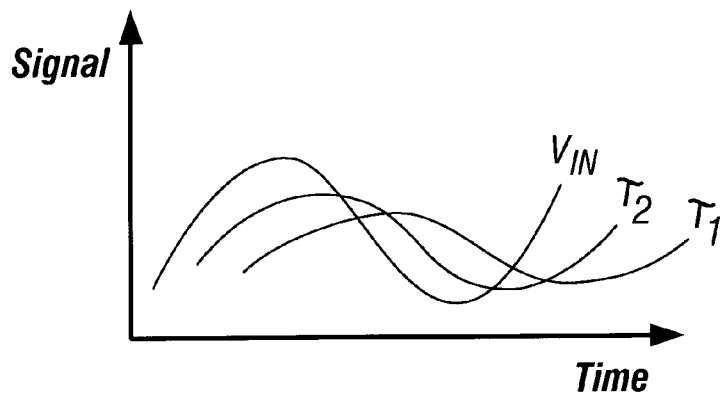
FIG. 19E is a graph showing the time-delay characteristics of the trimmable RC filters in FIGS. 19A–19C.

FIG. 19A illustrates how the trimmable resistor in FIG. 18A and/or how the trimmable capacitor structures in FIGS. 17A and 17B may be used to enable different time filter time constants in a trimmable RC filter, or, alternatively, different signal delays in a signal-delay system. FIG. 19B illustrates how an n-channel floating-gate transistor can be used to form a trimmable resistor similar to that shown in FIG. 18A and/or how the trimmable capacitor structures in FIGS. 17A and 17B may be used to enable different time filter time constants in a trimmable RC filter. FIG. 19C illustrates how a parallel connection of the trimmable resistor structures in FIGS. 19A and 19B and/or how the trimmable capacitor structures in FIGS. 17A and 17B may be used to enable different time filter time constants in a trimmable RC filter, or, alternatively, different signal delays in a signal-delay system. Whereas the symbols for the capacitor structures in the trimmable RC filters in FIGS. 19A–19C do not have an arrow drawn through them, those skilled in the art will understand that the capacitors may comprise conventional capacitor structures or, alternatively, the trimmable capacitor structures shown in FIGS. 17A and 17B above. FIG. 19D is a graph showing the transfer characteristics versus frequency of the trimmable RC filters in FIGS. 19A–19C. The graph shows that different time constant values $\tau=RC$ can be obtained by trimming the resistor and/or capacitor structures in the trimmable RC filters. According to embodiments of the present invention, the trimmable RC filters in FIGS. 19A–19C can be used in the time-interleaved and pipelined structures described above to alleviate mismatches among signal pathways, either in conjunction with the delay structures described or independent of any delay structures.

Figure 20:
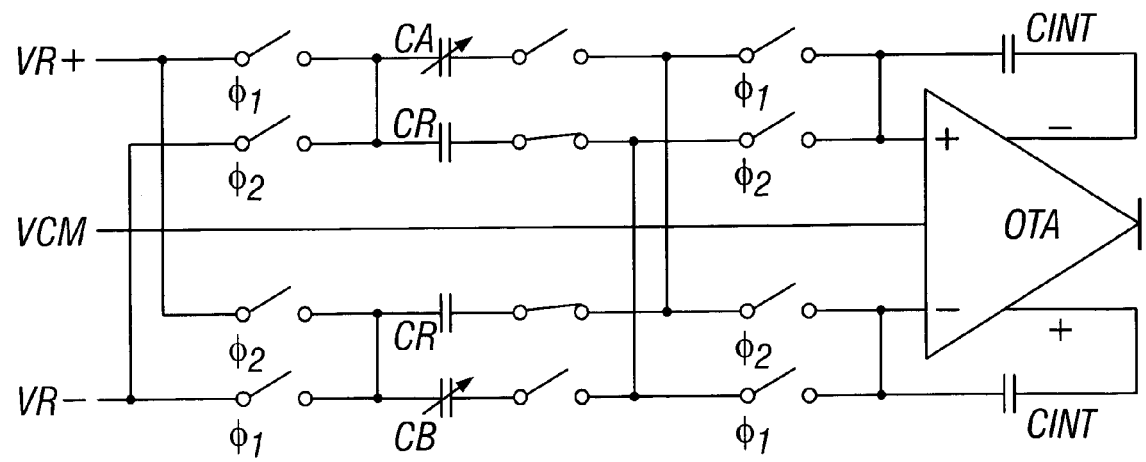
FIG. 20 shows a trimmable switched-capacitor DAC using trimmable capacitor structures like that in FIGS. 17A and 17B, according to an embodiment of the present invention.

FIG. 20 shows a trimmable switched-capacitor DAC using trimmable capacitor structures like that in FIGS. 17A and 17B, according to an embodiment of the present invention. By trimming the capacitors $C_A$ and or $C_B$, the transfer function of the switched-capacitor DAC can be made to more closely match its ideal transfer function. Trimmable inverters may also be used to set the optimal timing of the switching phases $\phi_1$ and $\phi_2$. As described above, using the floating-gate MOSFET structures in FIGS. 3A–3E, or equivalent structures, and the variable delay structures derived from the floating-gate MOSFET structures in FIGS. 4A–4C, significant improvements in the operation of time-interleaved and pipelined systems can be achieved. Indeed, the trimming devices and approaches of the present invention offer numerous advantages over other devices and methodologies.

The devices and methods of the present invention are advantageous over the prior art process of laser trimming or fusible links because adjusting the transistors themselves allows continuous calibration during a circuit's life. By contrast, laser trimming or fusible links typically are one-time factory trims. Also, adjustable transistors are much smaller than trimmable resistors or fusible links, saving circuit area and in some cases increasing circuit speed and/or power consumption (trim resistors and fusible links have large parasitic capacitance, requiring large currents to change their voltage rapidly).

The devices and methods of the present invention are advantageous over using trim capacitors or dynamic element matching because floating-gate MOSFETs have near-zero charge leakage. Accordingly, the update rates required to maintain calibration are set by circuit dynamics rather than by charge leakage. Update rates ranging from millihertz to kilohertz are reasonable. By contrast, traditional trim capacitors have significant leakage that increases with temperature. Consequently, applications that use traditional trim capacitors require rapid trimming (i.e. kilohertz rates or faster), often causing high-frequency spurious signals that interfere with the signal of interest. Likewise, dynamic element matching, that randomizes mismatch errors by continually swapping elements into and out of different parts of a circuit, must also operate at rapid switching rates. If an application requires only a few trim devices, then rapid updates pose no major issue. However, if an application requires hundreds or thousands of trim devices, rapid updates aren't feasible due to the sheer number of updates required. Floating-gate devices have significant advantage in these applications.

The devices and methods of the present invention are advantageous over using EEPROM trims because EEPROMs, whether binary or multi-valued, use floating gates just like analog floating-gate MOSFETs. The primary difference between the two is that EEPROMs store only digital values. It is common practice to use EEPROMs to store trimming information for analog circuits. However, when compared with analog-valued floating gates, EEPROMs have two disadvantages. First, because the stored information is digital, converting it into an analog quantity requires a DAC. Using a DAC to generate analog trim values consumes much more silicon die area than using analog-valued floating-gate MOSFETs. Second, because EEPROMs store digital values, any updates to the trim information must also be digital.

The devices and methods of the present invention are advantageous over using digital calibration. Digital calibration simply means tolerating any errors in the analog circuitry, and reducing the impact of these errors (digitally) at a later point in the system. For example, given an ADC with a transfer function nonlinearity, digital calibration seeks to eliminate the nonlinearity by multiplying the ADC output by the inverse nonlinearity. Although this approach works in selected applications, a primary issue with analog errors is that they cause information loss, and no amount of digital correction can recover the lost information. For example, if an ADC has a missing code (a situation in which two of the ADC codewords overlap), then the ADC cannot resolve an analog value that falls at the missing code location regardless of any subsequent digital processing. By contrast, using analog-valued floating gates to trim the ADC to eliminate its missing code solves the problem completely.

The devices and methods of the present invention are advantageous over using intrinsic matching. Intrinsic matching is a well-known technique for eliminating transistor mismatch errors, and basically involves making the transistors in a system large enough so that any statistical errors are negligibly small compared with the large transistors. A clear disadvantage of large transistors is that they consume large silicon die area, and also tend to consume more power because designers put more current through them to compensate for the added parasitic capacitance. Using analog-valued floating-gate MOSFETs to dynamically improve transistor matching saves silicon die area and reduces power compared with static trimming.

Whereas the above is a complete description of the preferred embodiments of the invention, various alternatives, modifications, and equivalents may be used without departing from the inventive concepts herein. For example, while embodiments of the present invention may be implemented in a double-well double-poly process and will work with low voltage processes (e.g., <=3 volts), the invention is not so limited and can be implemented in processes that support multiple polysilicon layers, single or multiple wells, and/or in higher voltage devices. Further, the concept of an n-well as used herein is intended to encompass not only conventional n-well devices, but also NLDD (N-type Lightly Doped Drain) devices and other lightly doped, or isolated structures that increase the reliable gate-drain and drain-source voltages of the device so that it, in effect, behaves like a conventional n-well device in this respect. It may also be implemented in thin film above the substrate with equivalent thin film structures. Finally, those of ordinary skill in the art will now recognize that floating gate may be fabricated in a number of ways other than by using polycrystalline silicon. For example, they may be fabricated of metal or other suitable conductors. Therefore, the above description should not be taken as limiting the scope of the invention as it is defined by the appended claims.

We claim:

1. A signal processing apparatus, comprising:
a time-interleaved system operable to distribute a signal into a first processing pathway and, following a predetermined amount of time, into a second processing pathway; and
a delay structure coupled to said second processing pathway, said delay structure including at least one floating-gate field effect transistor,
wherein the predetermined amount of time depends on an amount of electrical charge stored on the floating gate of the at least one floating-gate field effect transistor, said amount of electrical charge adjusting a slew rate of an output of the delay structure to thereby controllably influence a triggering time of a circuit associated with at least one of the first and second processing pathways.

2. The signal processing apparatus of claim 1 wherein the signal processing apparatus comprises an analog-to-digital converter.

3. The signal processing apparatus of claim 1 wherein the signal processing apparatus comprises a quadrature mixing circuit.

4. A signal processing apparatus, comprising:
an input node configured to receive a signal;
a splitter operable to split the signal into a first signal portion and a second signal portion and direct the first signal portion to a first node and directing the second signal portion to a second node; and
a first circuit coupled between said first node and a third node, said first circuit including a first analog-valued floating-gate transistor operable to effect a time delay on the first signal portion depending on an amount of electrical charge stored on a floating gate of said first transistor, said amount of electrical charge adjusting a slew rate of an output of the first circuit to thereby controllably influence a triggering time of a circuit associated with the third node.

5. The signal processing apparatus of claim 4, further comprising a second circuit coupled between said second node and a fourth node.

6. The signal processing apparatus of claim 5, further comprising a combiner operable to combine signals from outputs of said first and second circuits.

7. The signal processing apparatus of claim 6 wherein said second circuit includes a second analog-valued floating-gate transistor operable to effect a time delay on the second signal portion depending on an amount of electrical charge stored on a floating gate of said second transistor.

8. A signal processing apparatus, comprising:
a signal processing path including two or more signal processing elements; and
a time delay element disposed between adjacent processing elements of the two or more signal processing elements, said time delay element including at least one analog-valued floating-gate field effect transistor,
wherein a time delay of said time delay element depends on an amount of electrical charge stored on the floating gate of the at least one analog-valued floating-gate field effect transistor, said amount of electrical charge adjusting a slew rate of an output of the time delay element to thereby controllably influence a triggering time of at least one of the two or more signal processing elements.

9. The signal processing apparatus of claim 8, further comprising a combiner configured to receive and combine output signals from said adjacent processing elements.

10. An apparatus for processing a signal, comprising:
an input node configured to receive a signal;
an intermediate node;
an output node;
a first circuit coupled between said input node and said intermediate node, said first circuit including a first analog-valued floating-gate transistor operable to effect a time delay on the signal received at said input node depending on an amount of electrical charge stored on a floating gate of said first transistor; and
a second circuit disposed between said intermediate node and said output node, wherein said amount of electrical charge adjusts a slew rate of an output of the first circuit to thereby controllably influence a triggering time of the second circuit.

11. The apparatus of claim 10 wherein said second circuit includes a second analog-valued floating-gate transistor operable to effect a time delay on an intermediate signal received at said intermediate node depending on an amount of electrical charge stored on a floating gate of said second transistor.

12. An apparatus for processing a signal, comprising:
an input node configured to receive an input signal;
a splitter operable to split the input signal into at least a first signal portion and a second signal portion and direct the first signal portion to a first node and direct the second signal portion to a second node;
a first circuit coupled between said first node and a third node, said first circuit including a first analog-valued floating-gate transistor operable to effect a time delay on the first signal portion depending on an amount of electrical charge stored on a floating gate of said first transistor, said amount of electrical charge stored on the floating gate of said first transistor adjusting a slew rate of an output of the first circuit to thereby controllably influence a triggering time of a circuit connected to the third node; and
a second circuit coupled between said second node and a fourth node, said second circuit including a second analog-valued floating-gate transistor operable to effect a time delay on the second signal portion received depending on an amount of electrical charge stored on a floating gate of said second transistor, said amount of electrical charge stored on the floating gate of said second transistor adjusting a slew rate of an output of the second circuit to thereby controllably influence a triggering time of a circuit connected to the fourth node.

13. A method of processing a signal, comprising:
receiving an input signal at an input node;
splitting said input signal into a first portion and a second portion;
processing said first portion using a first circuit comprising a first analog-valued floating-gate transistor, said step of processing said first portion including effecting a time delay on said first portion depending on an amount of electrical charge stored on a floating gate of said first transistor, said amount of electrical charge adjusting a slew rate of an output of a delay structure associated with the floating-gate transistor to thereby controllably influence a triggering time of a circuit connected to the delay structure; and
processing said second portion.

14. The method of claim 13, further comprising a step of combining the processed first and second portions.

15. The method of claim 13 wherein the step of processing said second portion includes using a second circuit comprising a second analog-valued floating-gate transistor, said second step of processing said second portion including effecting a time delay on said second portion depending on an amount of electrical charge stored on a floating gate of said second transistor.

16. A method of processing a signal, comprising:
processing an input signal into an intermediate signal using a first circuit comprising a first analog-valued floating-gate transistor, said step of processing said input signal including effecting a time delay on said input signal depending an amount of electrical charge stored on a floating gate of said first transistor; and
processing said intermediate signal into an output signal, wherein said amount of electrical charge adjusts a slew rate of an output of a delay structure associated with the floating-gate transistor to thereby controllably influence a triggering time of a circuit connected to the delay structure.

17. The method of claim 16 wherein said step of processing said intermediate signal includes using a second circuit comprising a second analog-valued floating-gate transistor, said step of processing said intermediate signal including effecting a time delay on said intermediate signal depending on an amount of electrical charge stored on a floating gate of said second transistor.

18. A signal processing apparatus, comprising:
means for receiving an input signal at an input node;
means for splitting said input signal into a first portion and a second portion;
means for processing said first portion using a first circuit comprising a first analog-valued floating-gate transistor, said means for processing said first portion including effecting a time delay on said first portion depending on an amount of electrical charge stored on a floating gate of said first transistor; and
means for processing said second portion,
wherein said amount of electrical charge adjusts a slew rate of an output of a delay means associated with the floating-gate transistor to thereby controllably influence a triggering time of a circuit connected to the delay means.

19. The signal processing apparatus of claim 18, further comprising means for combining the processed first and second portions.

20. The signal processing apparatus of claim 18 wherein the means for processing said second portion includes using a second circuit comprising a second analog-valued floating-gate transistor, said means for processing said second portion including affecting a time delay on said second portion depending on an amount of electrical charge stored on a floating gate of said second transistor.

21. A signal processing apparatus, comprising:
means for processing an input signal into an intermediate signal using a first circuit comprising a first analog-valued floating-gate transistor, said means for processing said input signal including effecting a time delay on said input signal depending on an amount of electrical charge stored on a floating gate of said first transistor; and
means for processing said intermediate signal into an output signal,
wherein said amount of electrical charge adjusts a slew rate of an output of a delay means associated with the floating-gate transistor to thereby controllably influence a triggering time of a circuit connected to the delay means.

22. The signal processing apparatus of claim 21 wherein said means for processing said intermediate signal includes using a second circuit comprising a second analog-valued floating-gate transistor, said means for processing said intermediate signal including effecting a time delay on said intermediate signal depending on an amount of electrical charge stored on a floating gate of said second transistor.

23. A signal processing apparatus, comprising:
a time-interleaved system having two or more signal processing pathways, each signal processing pathway configured to receive a common input signal; and
one or more delay structures disposed in one or more of said two or more signal processing pathways, each delay structure including at least one floating-gate field effect transistor having a floating gate adapted store an amount of electrical charge so as to adjust a slew rate of an output of the delay structure to thereby controllably influence a triggering time of a circuit connected to the delay structure.

24. A signal processing apparatus, comprising:
means for receiving an input signal at an input node of a circuit;
means for splitting the input signal into first and second circuit paths of said circuit;
a floating-gate field effect transistor disposed in the first circuit path; and
means for modifying a first circuit characteristic in the first circuit path relative to a second circuit characteristic in the second circuit path by adjusting an amount of charge stored on a floating of the floating-gate field effect transistor, wherein the first circuit characteristic relates to frequency response, offset or transfer function of the first circuit path.

25. A signal processing apparatus, comprising:
means for receiving an input signal at an input node of a circuit;
means for splitting the input signal into first and second circuit paths of said circuit;
a floating-gate field effect transistor disposed in the first circuit path; and
means for modifying a first circuit characteristic in the first circuit path relative to a second circuit characteristic in the second circuit path by adjusting an amount of charge stored on a floating of the floating-gate field effect transistor, wherein the first circuit characteristic comprises a gain of a circuit element disposed in the first circuit path.

26. The signal processing apparatus of claim 25 wherein the circuit comprises a pipelined circuit.

27. The signal processing apparatus of claim 25 wherein the circuit comprises a time-interleaved circuit.

28. The signal processing apparatus of claim 25 wherein the means for modifying is operational during times when the signal processing apparatus is operating.

* * * * *